US010798318B2

(12) United States Patent
Izuhara

(10) Patent No.: US 10,798,318 B2
(45) Date of Patent: Oct. 6, 2020

(54) SOLID-STATE IMAGING ELEMENT, IMAGING DEVICE, AND ELECTRONIC DEVICE

(71) Applicant: SONY CORPORATION, Tokyo (JP)

(72) Inventor: Kunihiko Izuhara, Kanagawa (JP)

(73) Assignee: Sony Corporation, Toyko (JP)

( * ) Notice: Subject to any disclaimer, the term of this patent is extended or adjusted under 35 U.S.C. 154(b) by 29 days.

(21) Appl. No.: 16/086,148

(22) PCT Filed: Mar. 17, 2017

(86) PCT No.: PCT/JP2017/010848
§ 371 (c)(1),
(2) Date: Sep. 18, 2018

(87) PCT Pub. No.: WO2017/169878
PCT Pub. Date: Oct. 5, 2017

(65) Prior Publication Data
US 2019/0104260 A1    Apr. 4, 2019

(30) Foreign Application Priority Data

Mar. 31, 2016   (JP) ................................ 2016-072953

(51) Int. Cl.
*H04N 5/341* (2011.01)
*H01L 27/146* (2006.01)
(Continued)

(52) U.S. Cl.
CPC ....... *H04N 5/341* (2013.01); *H01L 27/14634* (2013.01); *H03K 19/1735* (2013.01);
(Continued)

(58) Field of Classification Search
CPC ........ H04N 5/341; H04N 5/335; H04N 5/379; H04N 5/3745; H03K 19/1735; H01L 27/14634
(Continued)

(56) References Cited

U.S. PATENT DOCUMENTS

2008/0174590 A1* 7/2008 Song ..................... H04N 5/70
                                                                345/212
2009/0046083 A1* 2/2009 Kim ...................... G09G 3/20
                                                                345/204

(Continued)

FOREIGN PATENT DOCUMENTS

JP    H02-111067    4/1990
JP    H03-257831    11/1991
(Continued)

OTHER PUBLICATIONS

International Search Report and Written Opinion prepared by the European Patent Office dated Jun. 9, 2017, for International Application No. PCT/JP2017/010848.
(Continued)

*Primary Examiner* — Yogesh K Aggarwal
(74) *Attorney, Agent, or Firm* — Sheridan Ross P.C.

(57) ABSTRACT

A solid-state imaging element includes a first substrate including a pixel circuit having a pixel array unit, and a second substrate. The second substrate includes signal processing circuits to process signals from the pixel array unit, and a wiring layer with wiring regions electrically connected to respective ones of the signal processing circuits. Each signal processing circuit has a same circuit pattern. The second substrate and the first substrate are stacked. A wiring pattern of each wiring region is different.

21 Claims, 20 Drawing Sheets

(51) Int. Cl.
*H04N 5/335* (2011.01)
*H04N 5/369* (2011.01)
*H03K 19/173* (2006.01)
*H04N 5/3745* (2011.01)

(52) U.S. Cl.
CPC ............. *H04N 5/335* (2013.01); *H04N 5/379* (2018.08); *H04N 5/3745* (2013.01)

(58) Field of Classification Search
USPC ........ 348/294–324; 250/208.1; 257/290–292
See application file for complete search history.

(56) References Cited

U.S. PATENT DOCUMENTS

| | | | |
|---|---|---|---|
| 2011/0249073 A1* | 10/2011 | Cranfill | H04N 5/2258 348/14.02 |
| 2012/0105696 A1 | 5/2012 | Maeda | |
| 2015/0296158 A1 | 10/2015 | Mansoorian et al. | |
| 2016/0156861 A1* | 6/2016 | Kitani | H04N 5/374 348/308 |
| 2017/0040371 A1 | 2/2017 | Izuhara | |
| 2017/0146998 A1 | 5/2017 | Yang et al. | |

FOREIGN PATENT DOCUMENTS

| | | |
|---|---|---|
| JP | H06-334346 | 12/1994 |
| JP | 2902506 | 3/1999 |
| JP | 2000-082093 | 3/2000 |
| JP | 2004-111802 | 4/2004 |
| JP | 2005-167003 | 6/2005 |
| JP | 4497844 | 4/2010 |
| JP | 2012-094720 | 5/2012 |
| JP | 2015-122730 | 7/2015 |
| JP | 2015-216334 | 12/2015 |
| WO | WO 03/065455 | 8/2003 |
| WO | WO 2015/162867 | 10/2015 |
| WO | WO 2016/019561 | 2/2016 |

OTHER PUBLICATIONS

Official Action (with English translation) for Japanese Patent Application No. 2016-072953, dated Mar. 26, 2020, 12 pages.

* cited by examiner

SOLID-STATE IMAGING ELEMENT, IMAGING DEVICE, AND ELECTRONIC DEVICE

CROSS REFERENCE TO RELATED APPLICATIONS

This application is a national stage application under 35 U.S.C. 371 and claims the benefit of PCT Application No. PCT/JP2017/010848 having an international filing date of 17 Mar. 2017, which designated the United States, which PCT application claimed the benefit of Japanese Patent Application No. 2016-072953 filed 31 Mar. 2016, the entire disclosures of each of which are incorporated herein by reference.

CROSS REFERENCE TO RELATED APPLICATIONS

This application is a national stage application under 35 U.S.C. 371 and claims the benefit of PCT Application No. PCT/JP2017/010848 having an international filing date of 17, Mar. 2017, which designated the United States, which PCT application claimed the benefit of Japanese Priority Patent Application JP 2016-072953 filed Mar. 31, 2016, the entire disclosures of each of which are incorporated herein by reference.

TECHNICAL FIELD

The present disclosure relates to a solid-state imagining element, an imaging device and an electronic device, and specifically, to a solid-state imaging element, an imaging device and an electronic device through which it is possible to implement a configuration using divided exposure at a low cost.

BACKGROUND ART

In the related art, when a solid-state imaging element whose area is greater than an exposure range of an exposure device is manufactured, divided exposure in which a solid-state imaging element is divided into a plurality of regions and an exposure is performed for each of the divided regions is used (for example, refer to PTL 1).

In addition, in the related art, in order to increase an aperture ratio of a solid-state imaging element, a lamination technology in which a pixel circuit including a pixel array unit and a signal processing circuit are formed in different semiconductor substrates, and the two semiconductor substrates are laminated and are electrically connected is used (for example, refer to PTL 2).

Therefore, for example, when a solid-state imaging element having a lamination structure whose area is greater than an exposure range of an exposure device is manufactured, divided exposure is performed for each of the semiconductor substrates.

However, in the divided exposure, a different photomask is used for each of the divided regions, high-precision alignment is necessary in a connection portion of the divided regions, a manufacturing process is complex, and a manufacturing cost increases.

Therefore, a technology in which a first substrate in which a pixel circuit including a pixel array unit is formed and a second substrate in which a plurality of signal processing circuits are formed are laminated and thus a cost is reduced is proposed (for example, refer to PTL 3).

CITATION LIST

Patent Literature

PTL 1: JP 2902506B
PTL 2: JP 4497844B
PTL 3: JP 2015-216334A

SUMMARY OF INVENTION

Technical Problem

Incidentally, in the above-described technology in PTL 3, when a plurality of substrates in which a signal processing circuit is provided are arranged and laminated in a pixel circuit, substrates in which the same wiring is formed are arranged and laminated.

Here, when it is possible to implement all processes of a device with any one block among the same blocks that are provided in a plurality of arranged substrates that are laminated in a pixel circuit, a block of any one substrate among the plurality of substrates is caused to function and blocks of the other substrates are changed to a standby state that is a state in which a function is disabled.

Accordingly, the blocks in the standby state become a useless configuration. As a result, there is a risk of a manufacturing cost increasing.

In addition, in divided exposure, in order to provide a different function according to a position of a divided region, a substrate including different signal processing circuits having functions according to divided positions is prepared or corresponding different signal processing circuits are laminated according to divided positions, which consume much time and effort. As a result, there is a risk of a manufacturing cost increasing.

Further, in the divided exposure, even if all divided regions have the same circuit pattern, a difference is generated in electrical characteristics for each of the divided regions. Therefore, there is a risk of signal processes being not synchronized, and signal processing results being not unified. As a result, there is a risk of image quality decreasing.

The present disclosure has been made in view of the above-described circumstances. Specifically, the present disclosure is provided to achieve high image quality in a configuration using divided exposure at a low cost.

Solution to Problem

According to a first aspect of the present disclosure, there is provided a solid-state imaging element in which a first substrate in which a pixel circuit including a pixel array unit is formed and a second substrate in which a plurality of signal processing circuits are formed are laminated, and a one-shot exposure wiring layer that changes a circuit configuration by changing a wiring pattern for each of the plurality of signal processing circuits that are formed in the second substrate is laminated on an uppermost layer of the second substrate.

The one-shot exposure wiring layer may be a part of the entire wiring layer in the second substrate and may be laminated on a layer above a wiring layer excluding the part.

The one-shot exposure wiring layer may be the entire wiring layer in the second substrate.

In the one-shot exposure wiring layer, in a portion in which a logic circuit is formed in the second substrate, a wiring pattern may be independently formed for each of the signal processing circuits.

In a substrate layer in each of the signal processing circuits, identical elements may be formed in an identical pattern.

According to the first aspect of the present disclosure, there is provided an imaging device in which a first substrate in which a pixel circuit including a pixel array unit is formed and a second substrate in which a plurality of signal processing circuits are formed are laminated, and a one-shot exposure wiring layer that changes a circuit configuration by changing a wiring pattern for each of the plurality of signal processing circuits that are formed in the second substrate is laminated on an uppermost layer of the second substrate.

According to the first aspect of the present disclosure, there is provided an electronic device in which a first substrate in which a pixel circuit including a pixel array unit is formed and a second substrate in which a plurality of signal processing circuits are formed are laminated, and a one-shot exposure wiring layer that changes a circuit configuration by changing a wiring pattern for each of the plurality of signal processing circuits that are formed in the second substrate is laminated on an uppermost layer of the second substrate.

According to the first aspect of the present disclosure, a first substrate in which a pixel circuit including a pixel array unit is formed and a second substrate in which a plurality of signal processing circuits are formed are laminated, and a one-shot exposure wiring layer that changes a circuit configuration by changing a wiring pattern for each of the plurality of signal processing circuits that are formed in the second substrate is laminated on an uppermost layer of the second substrate.

According to a second aspect of the present disclosure, there is provided a solid-state imaging element in which a first substrate in which a pixel circuit including a pixel array unit is formed and a second substrate in which a plurality of signal processing circuits are formed are laminated. The signal processing circuits have a configuration including $2^n$ types of functions and switch the functions according to an n-bit switching signal.

The n-bit switching signal may be fixed to Hi or Low in a processing procedure.

The n-bit switching signal may be fixed to Hi or Low through a bonding inside a logic substrate.

A line of the n-bit switching signal may be connected to a register and is controlled from an outside.

A line of the n-bit switching signal may be connected to a configuration in which a state is fixed to Hi or Low according to stress of electromagnetic waves including electricity or light such as ultraviolet light.

The n-bit switching signal line may be connected to a non-volatile memory and a state of the non-volatile memory is set from an outside.

A line of the n-bit switching signal may be connected to an external terminal and the switching signal is set by an external device through the external terminal.

According to the second aspect of the present disclosure, there is provided an imaging device in which a first substrate in which a pixel circuit including a pixel array unit is formed and a second substrate in which a plurality of signal processing circuits are formed are laminated. The signal processing circuits have a configuration including a circuit having $2^n$ types of functions and switch the functions according to an n-bit switching signal.

According to the second aspect of the present disclosure, there is provided an electronic device in which a first substrate in which a pixel circuit including a pixel array unit is formed and a second substrate in which a plurality of signal processing circuits are formed are laminated. The signal processing circuits have a configuration including a circuit having $2^n$ types of functions and switch the functions according to an n-bit switching signal.

According to the second aspect of the present disclosure, a first substrate in which a pixel circuit including a pixel array unit is formed and a second substrate in which a plurality of signal processing circuits are formed are laminated. The signal processing circuits have a configuration including a circuit having $2^n$ types of functions and switch the functions according to an n-bit switching signal.

Advantageous Effects of Invention

According to an aspect of the present disclosure, it is possible to achieve high image quality in a configuration using divided exposure at a low cost.

DESCRIPTION OF EMBODIMENTS

Figure 1:
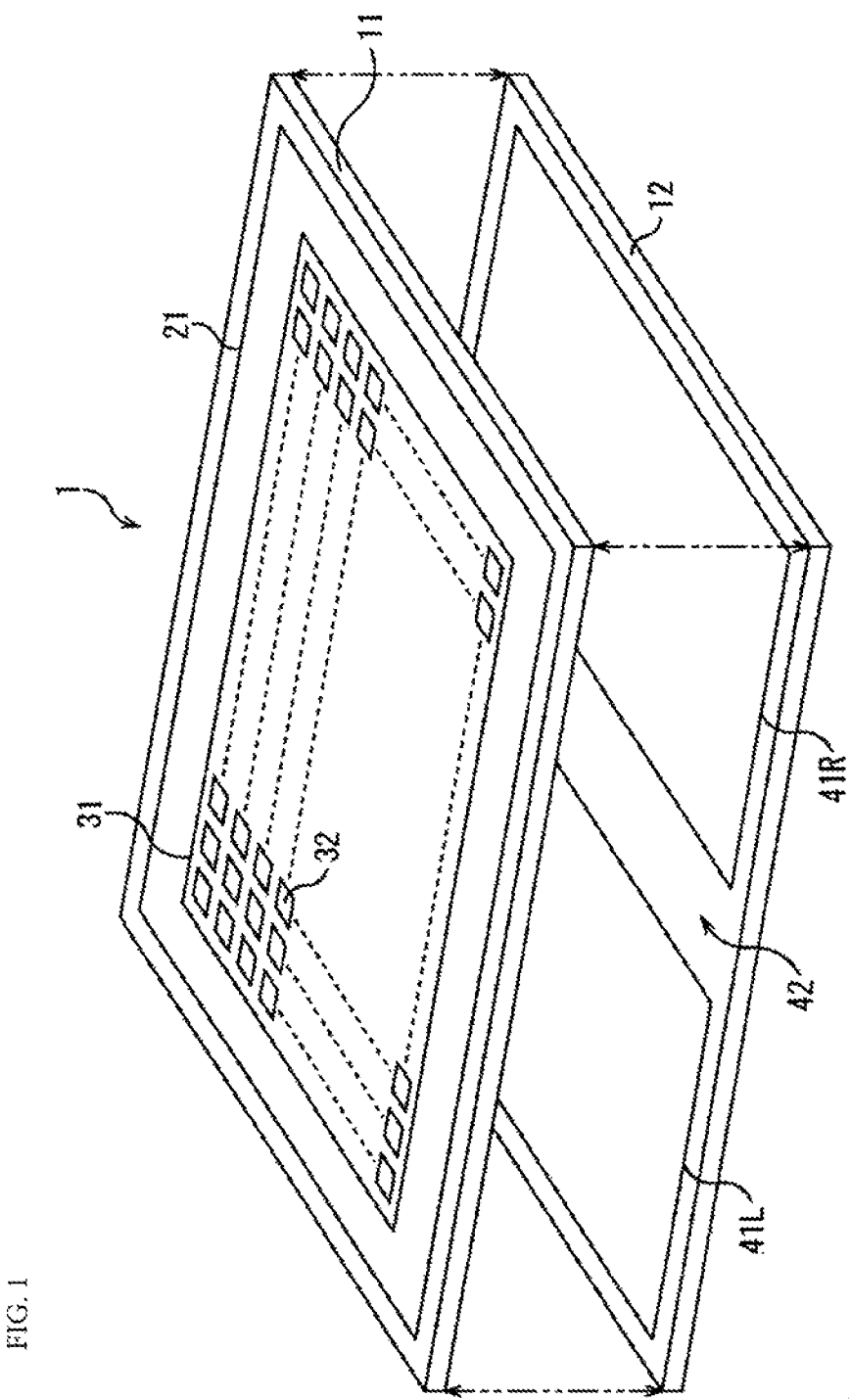
FIG. 1 is a perspective view schematically illustrating a solid-state imaging element according to a first embodiment of the present technology.

Hereinafter, embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

Hereinafter, forms (hereinafter referred to as "embodiments") for implementing the present technology will be described. The description will proceed in the following order.

1. First embodiment (example in which wiring layer having different left and right wiring patterns is formed on uppermost layer of wiring layer by one-shot exposure)
2. Second embodiment (example in which functions of left and right signal processing circuits are switched according to disposition)
3. Third embodiment (example in which reference clock signal is supplied to left and right signal processing circuits)
4. Fourth embodiment (example in which characteristic difference of ADC group is corrected)
5. Examples of application to electronic device
6. Use examples of solid-state imaging element 1. First Embodiment {1-1. System Configuration}

FIG. 1 is a perspective view schematically illustrating a configuration example of a solid-state imaging element 1 according to a first embodiment of the present technology. Here, while a case in which the solid-state imaging element 1 is a complementary metal oxide semiconductor (CMOS) image sensor is exemplified, the present technology is not limited to application to the CMOS image sensor.

The solid-state imaging element 1 is a semiconductor chip with a structure in which a pixel substrate 11 and a logic substrate 12 are laminated (a so-called lamination structure). In addition, the solid-state imaging element 1 is a back-illuminated CMOS image sensor and in which a wiring layer of the pixel substrate 11 and a wiring layer of the logic substrate 12 are laminated to be adjacent to each other. The present technology is not limited to application to the back-illuminated CMOS image sensor.

The pixel substrate 11 is a semiconductor substrate in which a pixel circuit 21 including a pixel array unit (a pixel unit) 31 in which unit pixels 32 including a photo-electric conversion element are two-dimensionally arranged in a matrix form is formed. In addition, although not illustrated, in a peripheral portion surrounding the pixel array unit 31 of the pixel circuit 21, for example, a pad for electrical connection with the outside and a via for electrical connection with the logic substrate 12 are provided. A pixel signal obtained from each of the unit pixels 32 of the pixel array unit 31 is an analog signal, and the analog pixel signal is transmitted from the pixel substrate 11 to the logic substrate 12 through the via or the like.

The logic substrate 12 is a semiconductor substrate in which a signal processing circuit 41L and a signal processing circuit 41R whose circuit patterns are the same are formed to be arranged at the left and right through a spacing (or scribing) region 42. In this drawing, a width of the spacing (or scribing) region 42 is widely exaggerated so that the drawing can be more easily understood. This is similar in subsequent drawings.

The signal processing circuit 41L performs, for example, predetermined signal processing including digitization (AD conversion) of an analog pixel signal read from each of the unit pixels 32 within a left half region of the pixel array unit 31 and stores the signal-processed pixel data. In addition, the signal processing circuit 41L reads, for example, the stored pixel data in a predetermined order and outputs the data to the outside of the chip. Accordingly, image data obtained by the unit pixel 32 within the left half region of the pixel array unit 31 is output from the signal processing circuit 41L.

The signal processing circuit 41R performs, for example, predetermined signal processing including digitization (AD conversion) of an analog pixel signal read from each of the unit pixels 32 within a right half region of the pixel array unit 31 and stores the signal-processed pixel data. In addition, the signal processing circuit 41R reads, for example, the stored pixel data in a predetermined order and outputs the data to the outside of the chip. Accordingly, image data obtained by the unit pixel 32 within the right half region of the pixel array unit 31 is output from the signal processing circuit 41R.

In addition, the signal processing circuit 41L and the signal processing circuit 41R are synchronized with, for example, the pixel circuit 21, and control units of the solid-state imaging element 1.

In this manner, according to a lamination structure of the pixel substrate 11 and the logic substrate 12, an area of the pixel substrate 11 and an area of the pixel array unit 31 can be substantially the same. As a result, it is possible to reduce a size of the solid-state imaging element 1 and thus reduce a size of the entire chip. In addition, it is possible to increase an aperture ratio of the solid-state imaging element 1.

Further, since a process appropriate for preparing the unit pixel 32 or the like can be applied to the pixel substrate 11 and a process appropriate for preparing the signal processing circuits 41L and 41R can be applied to the logic substrate 12, it is possible to optimize the process when the solid-state imaging element 1 is manufactured.

The pixel circuit 21 has an area that is larger than an exposure range of an exposure device and thus divided exposure is necessary. On the other hand, the signal processing circuit 41L and the signal processing circuit 41R have areas that are smaller than the exposure range of the exposure device and one-shot exposure is possible.

Hereinafter, the signal processing circuit 41L and the signal processing circuit 41R will be simply designated as a signal processing circuit 41 when not being individually distinguished.

{1-2. Circuit Configuration}

Figure 2:
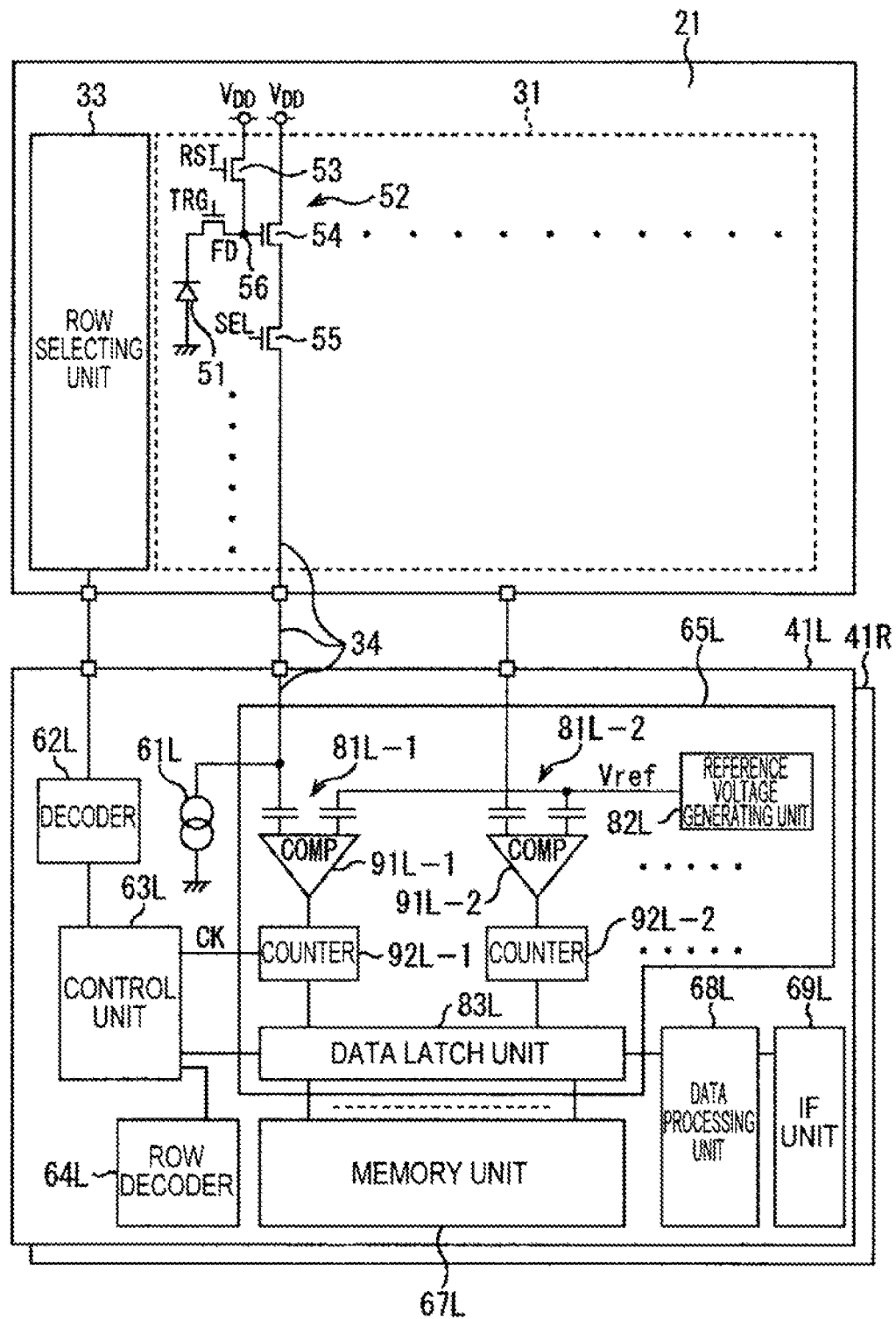
FIG. 2 is a circuit diagram illustrating a specific configuration of a pixel circuit and a signal processing circuit of the solid-state imaging element according to the first embodiment.

FIG. 2 is a circuit diagram illustrating a specific configuration of the pixel circuit 21 of the pixel substrate 11 side and the signal processing circuits 41L and 41R of the logic substrate 12 side of the solid-state imaging element 1. As described above, the pixel circuit 21 and the signal processing circuits 41L and 41R are electrically connected through a via (not illustrated).

(Configuration of Pixel Circuit 21)

First, a configuration of the pixel circuit 21 of the pixel substrate 11 side will be described. In the pixel circuit 21, in addition to the pixel array unit 31 in which the unit pixels 32 are two-dimensionally arranged in a matrix form, a row selecting unit 33 configured to select each of the unit pixels 32 of the pixel array unit 31 in units of rows based on an address signal provided from the logic substrate 12 side is provided. Here, while the row selecting unit 33 is provided on the pixel substrate 11 side, it can be provided on the logic substrate 12 side.

The unit pixel 32 includes, for example, a photodiode 51, as a photoelectric conversion element. In addition, the unit pixel 32 includes four transistors, for example, a transfer transistor (a transfer gate) 52, a reset transistor 53, an amplifying transistor 54, and a selection transistor 55, in addition to the photodiode 51.

Here, as the four transistors 52 to 55, for example, N channel transistors are used. However, a combination of conductivity types of the transfer transistor 52, the reset transistor 53, the amplifying transistor 54, and the selection transistor 55 exemplified here is only an example, and the present disclosure is not limited to such a combination. In other words, a combination of P channel transistors can be used as necessary.

A transfer signal TRG, a reset signal RST, and a selection signal SEL that are drive signals for driving the unit pixel 32 are appropriately provided to the unit pixel 32 from the row selecting unit 33. That is, the transfer signal TRG is applied to a gate electrode of the transfer transistor 52, the reset signal RST is applied to a gate electrode of the reset transistor 53, and the selection signal SEL is applied to a gate electrode of the selection transistor 55.

The photodiode 51 has an anode electrode that is connected to a low potential side power supply (for example, a ground), photoelectrically converts received light (incident light) into light charges (here, photoelectrons) of a charge amount corresponding to a light intensity thereof, and accumulates the light charges. A cathode electrode of the photodiode 51 is electrically connected to a gate electrode of the amplifying transistor 54 through the transfer transistor 52. A node 56 that is electrically connected to the gate electrode of the amplifying transistor 54 is referred to as a floating diffusion (FD) unit (a floating diffusion region).

The transfer transistor 52 is connected between the cathode electrode of the photodiode 51 and the FD unit 56. A transfer signal TRG having a high level (for example, a $V_{DD}$ level) of active (hereinafter referred to as "High active") is provided from the row selecting unit 33 to the gate electrode of the transfer transistor 52. In response to the transfer signal TRG, the transfer transistor 52 is changed to a conductive state, and transfers light charges that are photoelectrically converted in the photodiode 51 to the FD unit 56.

The reset transistor 53 includes a drain electrode that is connected to a pixel power supply $V_{DD}$ and a source electrode that is connected to the FD unit 56. A reset signal RST of High active is provided from the row selecting unit 33 to the gate electrode of the reset transistor 53. In response to the reset signal RST, the reset transistor 53 is changed to a conductive state, discards charges of the FD unit 56 to the pixel power supply $V_{DD}$ and thus resets the FD unit 56.

The amplifying transistor 54 includes a gate electrode that is connected to the FD unit 56 and a drain electrode that is connected to the pixel power supply $V_{DD}$. Therefore, the amplifying transistor 54 outputs a potential of the FD unit 56 that has been reset by the reset transistor 53 as a reset signal (reset level) $V_{reset}$. The amplifying transistor 54 further outputs a potential of the FD unit 56 after a signal charge is transferred by the transfer transistor 52 as a light accumulation signal (signal level) $V_{sig}$.

The selection transistor 55 includes, for example, a drain electrode that is connected to a source electrode of the amplifying transistor 54 and a source electrode that is connected to a signal line 34. A selection signal SEL of High active is provided from the row selecting unit 33 to the gate electrode of the selection transistor 55. In response to the selection signal SEL, the selection transistor 55 is changed to a conductive state, the unit pixel 32 is changed to a selection state, and a signal output from the amplifying transistor 54 is read in the signal line 34.

As can be clearly understood from the above, from the unit pixel 32, the reset potential of the FD unit 56 is read as a reset level $V_{reset}$, and the potential of the FD unit 56 after the signal charge is transferred is read as a signal level $V_{sig}$ in order in the signal line 34. Incidentally, the signal level $V_{sig}$ also includes a component of the reset level $V_{reset}$.

Here, while the selection transistor 55 has a circuit configuration that connects the source electrode of the amplifying transistor 54 and the signal line 34, it can have a circuit configuration that connects the pixel power supply $V_{DD}$ and the drain electrode of the amplifying transistor 54.

In addition, a pixel configuration of the unit pixel 32 is not limited to a pixel configuration including the four transistors. For example, a pixel configuration including three transistors in which the amplifying transistor 54 has a function of the selection transistor 55, and a pixel configuration in which transistors subsequent to the FD unit 56 are shared among a plurality of photoelectric conversion elements (among pixels) may be used, and any configuration of the pixel circuit may be used.

(Configuration of Signal Processing Circuits 41L and 41R)

Next, a configuration of the signal processing circuits 41L and 41R of the logic substrate 12 side will be described. As described above, the signal processing circuit 41L and the signal processing circuit 41R have the same circuit pattern. Here, the description will proceed, focusing on a configuration of the signal processing circuit 41L.

The signal processing circuit 41L is a circuit configured to process mainly a pixel signal from the unit pixel 32 within the left half region of the pixel array unit 31. The signal processing circuit 41L includes a current source 61L, a decoder 62L, a control unit 63L, a row decoder 64L, a signal processing unit 65L, a column decoder/sense amplifier 66L, a memory unit 67L, a data processing unit 68L, and an interface (IF) unit 69L.

The current source 61L is connected to each signal line 34 in which a signal is read from each of the unit pixels 32 of the pixel array unit 31 for each pixel column. The current source 61L has, for example, a configuration of a so-called load MOS circuit including a MOS transistor in which a gate potential is biased to a constant potential so that a constant current is supplied to the signal line 34. The current source 61L including the load MOS circuit supplies a constant current to the amplifying transistor 54 of the unit pixel 32 of a selected row and causes the amplifying transistor 54 to operate as a source follower.

When each of the unit pixels 32 of the pixel array unit 31 is selected in units of rows under control of the control unit 63L, the decoder 62L provides an address signal for designating an address of the selected row to the row selecting unit 33.

When pixel data is written in the memory unit 67L or pixel data is read from the memory unit 67L under control of the control unit 63L, the row decoder 64L designates a row address.

The signal processing unit 65L includes at least AD converters 81L-1 to 81L-n that perform digitization (AD conversion) of an analog pixel signal that is read from each of the unit pixels 32 of the pixel array unit 31 through the signal line 34. Therefore, the signal processing unit 65L has a configuration in which signal processing (column-parallel AD) of the analog pixel signal is performed in units of pixel columns in parallel. Hereinafter, the AD converters 81L-1 to 81L-n will be simply designated as an AD converter 81L when not being individually distinguished.

The signal processing unit 65L further includes a reference voltage generating unit 82L configured to generate a reference voltage that is used when AD conversion is performed in each of the AD converters 81L. The reference voltage generating unit 82L generates a reference voltage of a so-called ramp waveform (a slope-shaped waveform) whose voltage value is changed stepwise as a time has elapsed. The reference voltage generating unit 82L can have a configuration using, for example, a digital-analog conversion (DAC) circuit.

The AD converter 81L is provided, for example, for each pixel column of the pixel array unit 31, that is, for each signal line 34. In other words, the AD converter 81L is a so-called column-parallel AD converter that is disposed only in a number of pixel columns of the left half of the pixel array unit 31. Therefore, each of the AD converters 81L generates, for example, a pulse signal having a size (a pulse width) in a time axis direction corresponding to a size of a level of a pixel signal, measures a length of a period of the pulse width of the pulse signal, and thus performs an AD converting process.

More specifically, for example, the AD converter 81L-1 has a configuration including at least a comparator (COMP) 91L-1 and a counter 92L-1, as illustrated in FIG. 2. The comparator 91L-1 compares two inputs in which the analog pixel signal (the above-described signal level $V_{sig}$ and reset level $V_{reset}$) read from the unit pixel 32 through the signal line 34 is used as a comparison input, and a reference voltage $V_{ref}$ of a ramp wave supplied from the reference voltage generating unit 82L is used as a reference input.

Therefore, the comparator 91L-1 has, for example, an output that is changed to a first state (for example, a high level) when the reference voltage $V_{ref}$ is greater than a pixel signal, and has an output that is changed to a second state (for example, a low level) when the reference voltage $V_{ref}$ is equal to or lower than a pixel signal. An output signal of the comparator 91L-1 is changed to a pulse signal having a pulse width corresponding to a level size of the pixel signal.

For example, an up/down counter is used for the counter 92L-1. In the counter 92L-1, a clock CK is provided at the same timing as a supply start timing of the reference voltage $V_{ref}$ for the comparator 91L. The counter 92L-1, which is an up/down counter, performs down count or up count in synchronization with the clock CK, and thus measures a period of a pulse width of an output pulse of the comparator 91L-1, that is, a comparison period from when a comparison operation starts until the comparison operation ends. When the measurement operation is performed, the counter 92L-1 performs down count for the reset level $V_{reset}$ and performs up count for the signal level $V_{sig}$ with respect to the reset level $V_{reset}$ and the signal level $V_{sig}$ that are sequentially read from the unit pixel 32.

According to an operation of the down count/up count, it is possible to obtain a difference between the signal level $V_{sig}$ and the reset level $V_{reset}$. As a result, in the AD converter 81L-1, a correlated double sampling (CDS) process is performed in addition to the AD converting process. Here, the CDS process is a process in which a difference between the signal level $V_{sig}$ and the reset level $V_{reset}$ is obtained, and reset noise of the unit pixel 32 and pixel-specific fixed pattern noise such as a threshold value variation of the amplifying transistor 54 are removed. Therefore, a count result (a count value) of the counter 92L-1 is changed to a digital value in which the analog pixel signal is digitized.

Since the AD converters 81L-2 to 81L-n also have the same configuration as the AD converter 81L-1, repeated descriptions thereof will be omitted. In addition, hereinafter, the comparators 91L-1 to 91L-n will be simply designated as a comparator 91L when not being individually distinguished, and the counters 92L-1 to 92L-n will be simply designated as a counter 92L when not being individually distinguished.

Figure 3:
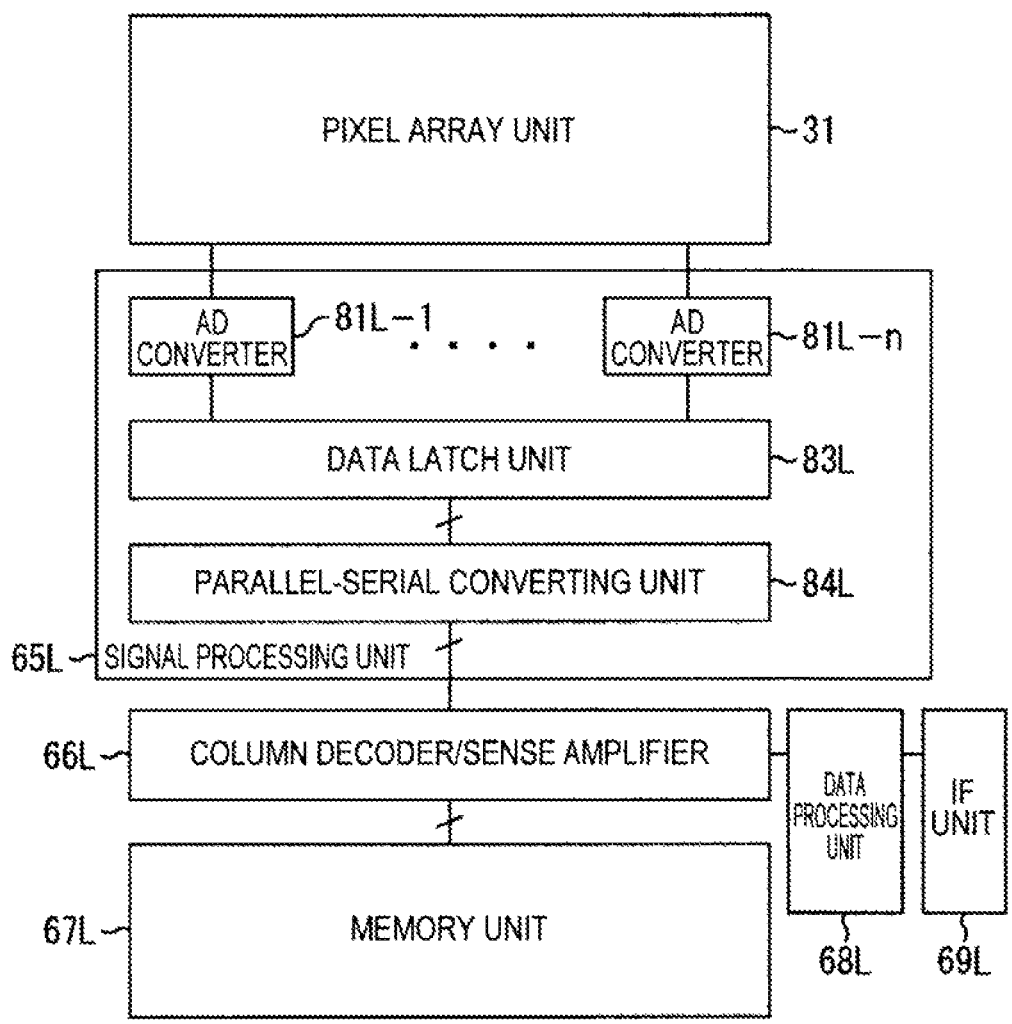
FIG. 3 is a block diagram illustrating a specific configuration example of a signal processing unit of the solid-state imaging element according to the first embodiment.

FIG. 3 is a block diagram illustrating an example of a specific configuration of the signal processing unit 65L. The signal processing unit 65L includes a data latch unit 83L and a parallel to serial (hereinafter referred to as "parallel-serial") converting unit 84L in addition to the AD converter 81L and the reference voltage generating unit 82L. Therefore, the signal processing unit 65L has a pipeline configuration in which pixel data digitized in the AD converter 81L is pipeline-transferred to the memory unit 67L. In this case, the signal processing unit 65L performs a digitization process by the AD converter 81L within one horizontal period and performs a process in which the digitized pixel data is transferred to the data latch unit 83L within one horizontal period.

On the other hand, the column decoder/sense amplifier 66L is provided at the memory unit 67L as a peripheral circuit thereof. While the above-described row decoder 64L (refer to FIG. 2) designates a row address for the memory unit 67L, the column decoder designates a column address for the memory unit 67L. In addition, the sense amplifier amplifies a weak voltage read from the memory unit 67L through a bit line to a level that can be handled as a digital level. Therefore, pixel data read through the column decoder/sense amplifier 66L is output to the outside of the logic substrate 12 through the data processing unit 68L and the interface unit 69L.

Here, while a case in which one column-parallel AD converter 81L is provided has been exemplified, the present disclosure is not limited thereto. A configuration in which two or more AD converters 81L are provided and a digitization process is performed in the two or more AD converters 81L in parallel can be used.

In this case, the two or more AD converters 81L are disposed, for example, in a direction in which the signal line 34 of the pixel array unit 31 extends, that is, disposed to be divided at upper and lower sides of the pixel array unit 31. When the two or more AD converters 81L are provided, two data latch units 83L, two parallel-serial converting units 84L, and two memory units 67L (two systems) are provided in correspondence thereto.

In this manner, in the solid-state imaging element 1 having a configuration in which, for example, the AD converters 81L of two systems are provided, row scanning is performed in parallel for every two pixel rows. Therefore, a signal of each pixel of one pixel row is read at one side in a vertical direction of the pixel array unit 31, a signal of each pixel of the other pixel row is read at the other side in the vertical direction of the pixel array unit 31, and a digitization process is performed in the two AD converters 81L in parallel. Similarly, the subsequent signal processes are performed in parallel. As a result, compared to when row scanning is performed for one pixel row, it is possible to read pixel data at a high speed.

Although detailed drawings and descriptions are omitted, the signal processing circuit 41R also has a configuration similar to that of the signal processing circuit 41L. Therefore, the signal processing circuit 41R mainly performs a process of a pixel signal from the unit pixel 32 within the right half region of the pixel array unit 31.

Hereinafter, in signs of components of the signal processing circuit 41R which are not illustrated, the letter R replaces the letter L in signs assigned to components of the signal processing circuit 41L.

{1-3. Layout of Logic Substrate 12}

Figure 4:
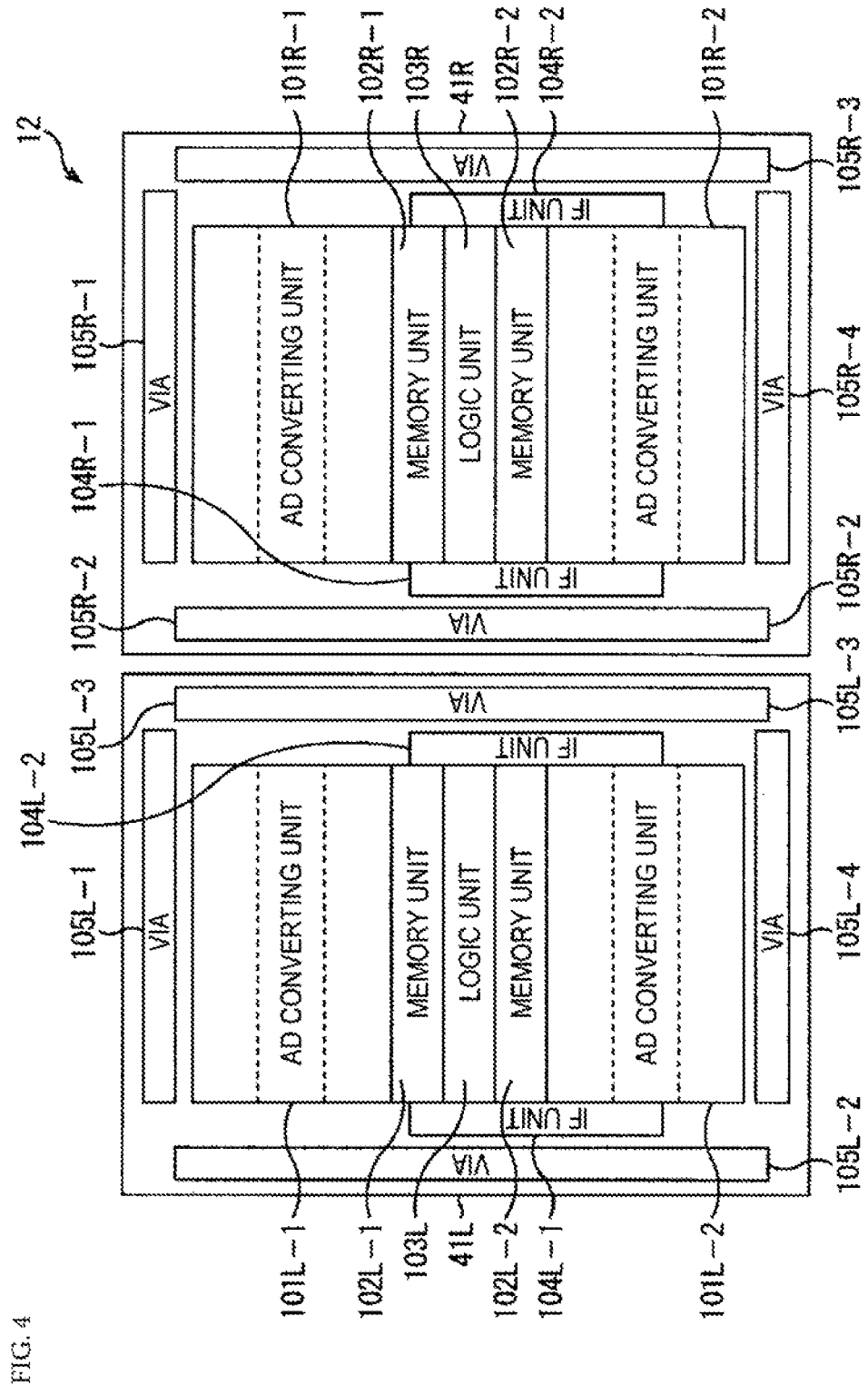
FIG. 4 is a diagram schematically illustrating a layout of a logic substrate of the solid-state imaging element according to the first embodiment.

FIG. 4 shows an example of a layout of the logic substrate 12. As illustrated in FIG. 4, the signal processing circuit 41L and the signal processing circuit 41R of the logic substrate 12 have the same layouts that are bilaterally symmetrical.

In the signal processing circuit 41L, an AD converting unit 101L-1, a memory unit 102L-1, a logic unit 103L, a memory unit 102L-2, and an AD converting unit 101L-2 are laminated from the top to the bottom. In addition, an interface unit 104L-1 and an interface unit 104L-2 are disposed at the left and right of the lamination portion. Further, vias 105L-1 to 105L-4 are disposed at vertical and horizontal ends of the signal processing circuit 41L.

In the AD converting units 101L-1 and 101L-2, for example, the current source 61L, the AD converters 81L-1 to 81L-n, the reference voltage generating unit 82L, the data latch unit 83L and the parallel-serial converting unit 84L illustrated in FIG. 2 and FIG. 3 are separately disposed.

In this example, in the AD converting units 101L-1 and 101L-2, the AD converter 81L and a circuit portion associated therewith are laminated and disposed in three stages. That is, in the signal processing circuit 41L, the AD converter 81L and a circuit portion associated therewith are separately disposed into six systems. Therefore, the signal processing circuit 41L performs row scanning, for example, for every six pixel rows, in parallel.

In addition, a pixel signal from each of the unit pixels 32 of the pixel array unit 31 is supplied to each of the AD converters 81L that are disposed in the AD converting units 101L-1 and 101L-2 through the vias 105L-1 to 105L-4.

In the memory units 102L-1 and 102L-2, for example, the column decoder/sense amplifier 66L and the memory unit 67L illustrated in FIG. 3 are separately disposed. Therefore, the memory unit 102L-1 stores pixel data supplied from the AD converting unit 101L-1, and the memory unit 102L-2 stores pixel data supplied from the AD converting unit 101L-2.

In the logic unit 103L, for example, the decoder 62L, the control unit 63L, the row decoder 64L, and the data processing unit 68L illustrated in FIG. 2 are disposed.

In the interface units 104L-1 and 104L-2, for example, the interface unit 69L illustrated in FIG. 2 is disposed.

Since the signal processing circuit 41R has the same layout as the signal processing circuit 41L, repeated descriptions thereof will be omitted.

In addition, the above-described configuration and layout of the signal processing circuits 41L and 41R are only examples, and a configuration and a layout other than the above-described configuration and layout can be used.

{1-4. Image Process of Solid-State Imaging Element 1}

Next, an image process of the solid-state imaging element 1 will be briefly described with reference to FIG. 5 and FIG. 6.

Figure 5:
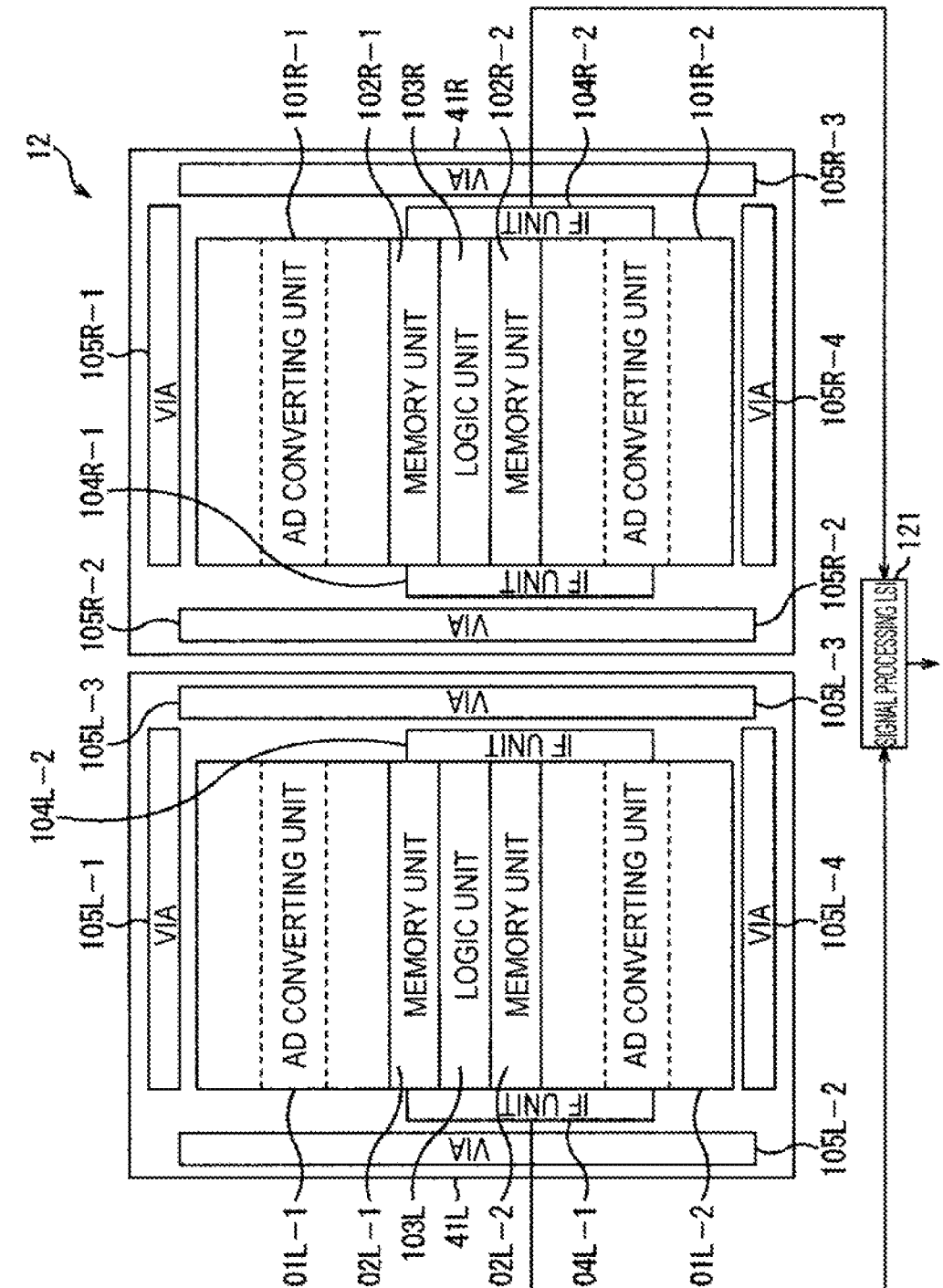
FIG. 5 is a diagram illustrating an example of a method of connecting signal processing circuits.

FIG. 5 shows an example of a method of connecting the signal processing circuits 41L and 41R of the solid-state imaging element 1 and an external signal processing LSI 121. Specifically, the signal processing LSI 121 is connected to the interface unit 104L-1 of the signal processing circuit 41L and an interface unit 104R-2 of the signal processing circuit 41R.

Figure 6:
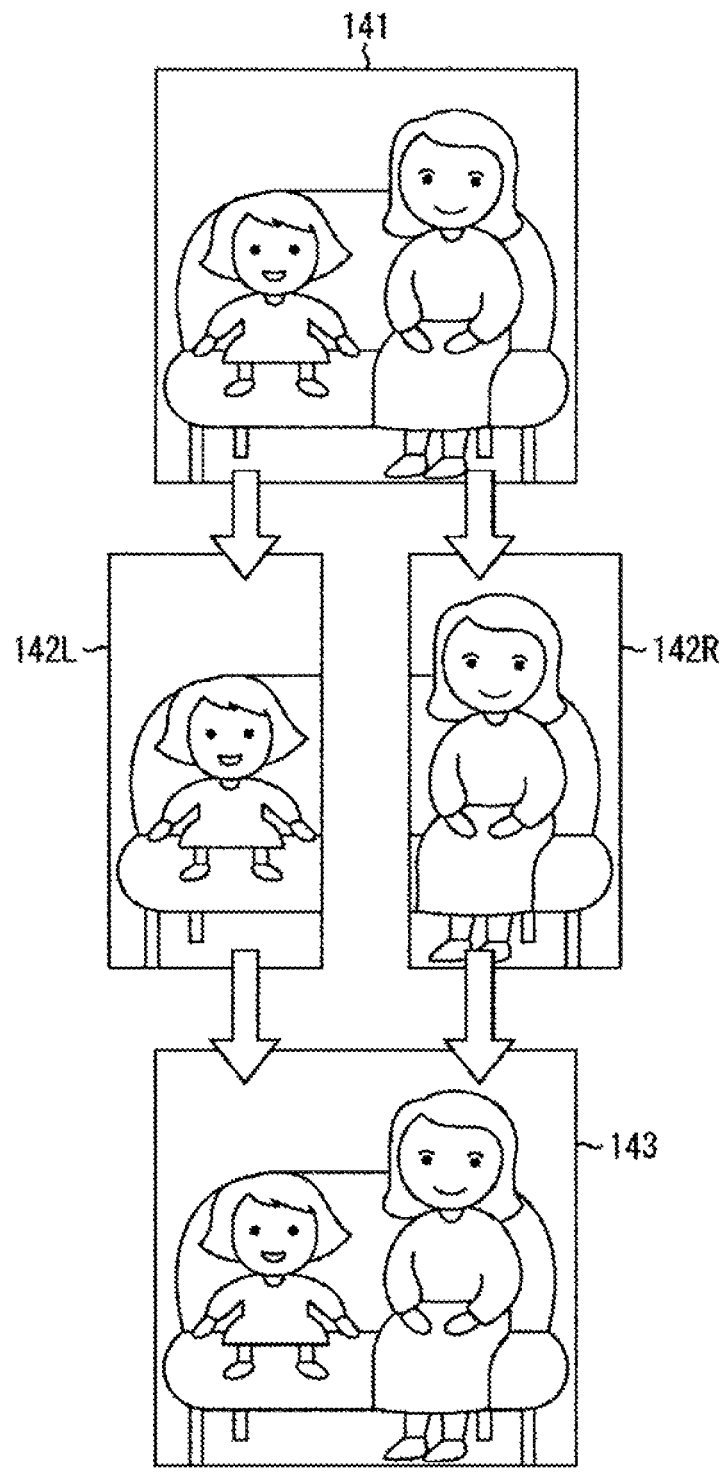
FIG. 6 is a diagram for describing an image process of the solid-state imaging element according to the first embodiment.

For example, when a subject 141 of FIG. 6 is imaged by the solid-state imaging element 1, a pixel signal from the unit pixel 32 within the left half region of the pixel array unit 31 is supplied to the signal processing circuit 41L, and a pixel signal from the unit pixel 32 within the right half region thereof is supplied to the signal processing circuit 41R, that is, a pixel signal corresponding to the left half of the subject 141 is supplied to the signal processing circuit 41L and a pixel signal corresponding to the right half of the subject 141 is supplied to the signal processing circuit 41R.

The signal processing circuit 41L generates image data 142L corresponding to the left half of the subject 141 based on a pixel signal supplied from the pixel circuit 21. Similarly, the signal processing circuit 41R generates image data 142R corresponding to the right half of the subject 141 based on a pixel signal supplied from the pixel circuit 21.

Therefore, the signal processing circuit 41L outputs the generated image data 142L from the interface unit 104L-1 and supplies the data to the signal processing LSI 121. The signal processing circuit 41R outputs the generated image data 142R from the interface unit 104R-2 and supplies the data to the signal processing LSI 121.

The signal processing LSI 121 generates one piece of image data 143 by synthesizing the image data 142L and the image data 142R, and outputs the generated image data 143.

In this manner, in the solid-state imaging element 1, since left and right pieces of image data are independently generated, it is possible to perform a process at a high speed.

{1-5. Detailed Configuration of Signal Processing Circuits 41L and 41R}

Incidentally, a case in which the signal processing circuits 41L and 41R have the same circuit pattern has been described above. Although circuit patterns for the same actual function are the same, there are configurations in which it is sufficient for them to be provided not in both but in any of the signal processing circuits 41L and 41R when pixel signals from the unit pixel 32 within the region of the pixel array unit 31, which will be subjected to signal processing on the left and right, are processed.

In particular, there is a configuration in which, within the logic substrate 12 described with reference to FIG. 4, it is sufficient for the logic units 103L and 103R to be provided at either side thereof.

Figure 7:
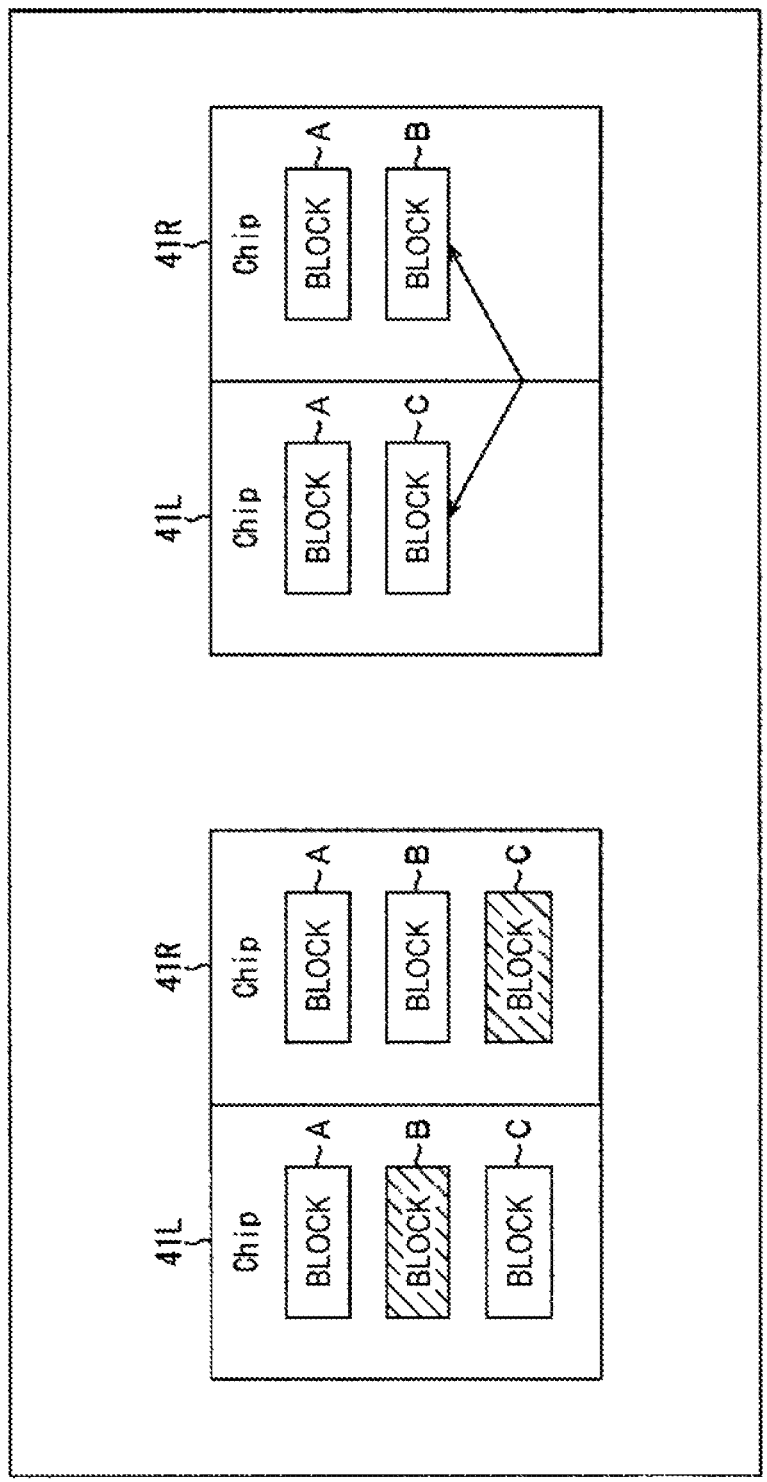
FIG. 7 is a diagram describing a configuration example when left and right signal processing circuits have different configurations.

For example, as illustrated on the left in FIG. 7, since the signal processing circuits 41L and 41R have the same circuit pattern, blocks A to C having different functions are provided in the signal processing circuits 41L and 41R.

Here, when it is sufficient for the blocks B and C to be provided in either of the signal processing circuits (chips) 41L and 41R, in general, for example, as indicated by a shaded portion on the left in FIG. 7, the block B is changed to the standby state in the signal processing circuit 41L, and the block C is changed to the standby state in the signal processing circuit 41R.

Here, the standby state is, for example, a state in which a wire for inputting and outputting a signal is not connected to the blocks B and C provided in a substrate layer, for example, according to a configuration of a wiring layer, and is a state in which the blocks B and C are not substantially used and configurations in the standby state are indicated by shaded portions in FIG. 7.

That is, in a case in which a plurality of signal processing circuits 41 having the same circuit pattern are used, when any one among the same blocks provided in each of the signal processing circuits 41 functions, if it is not necessary for the others to function, in general, as illustrated on the left in FIG. 7, only necessary blocks remain and the other blocks are changed to the standby state in which they are not used.

However, in such a configuration, blocks that are in the standby state and do not function are wasted and a mounting area is occupied by blocks that do not function.

Therefore, as illustrated on the right in FIG. 7, in uppermost layers of the signal processing circuits 41L and 41R and further, in regions corresponding to the signal processing circuits 41L and 41R, one-shot exposure wiring layers that are different wiring layers are provided. Accordingly, blocks A and C are provided in a wiring layer of the uppermost layer of the signal processing circuit 41L and blocks A and B are provided in a wiring layer of the uppermost layer of the signal processing circuit 41R.

Figure 8:
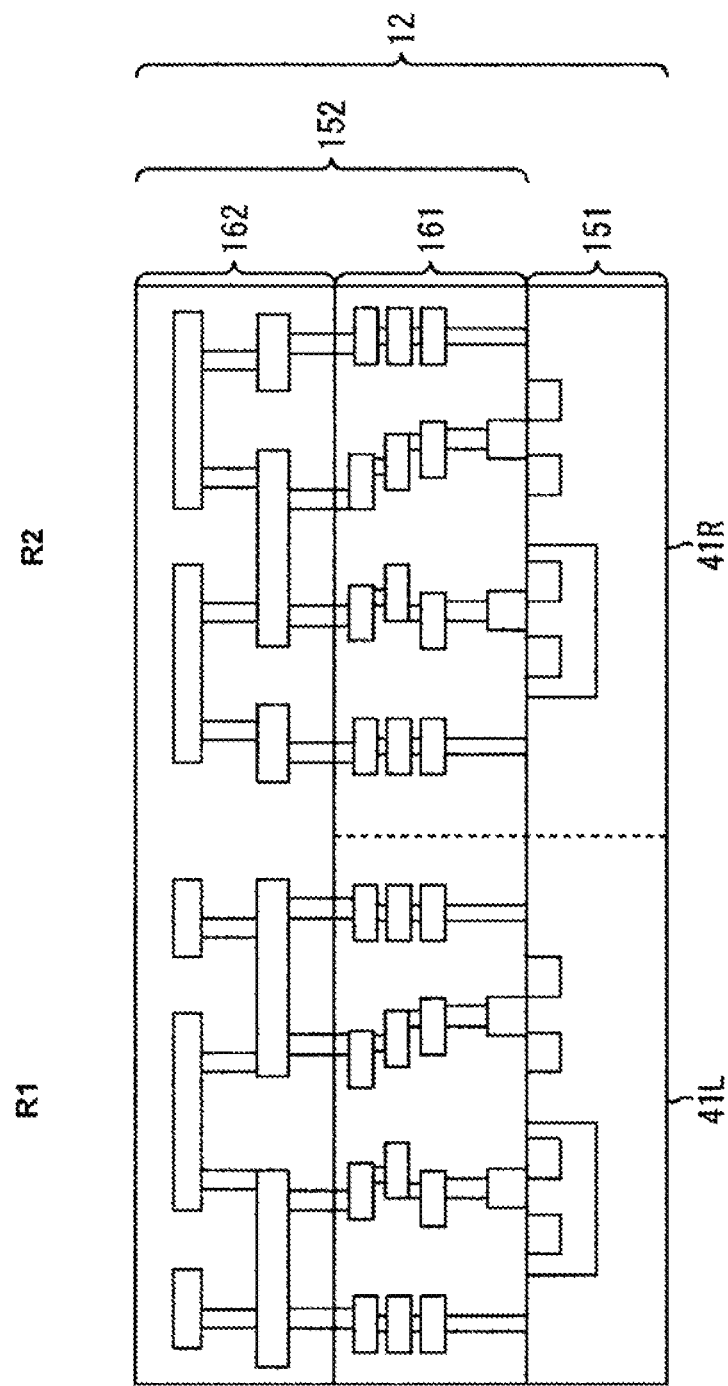
FIG. 8 is a diagram describing an example in which, only an uppermost layer of a wiring layer, wiring layers having different left and right wiring patterns formed by one-shot exposure are laminated.

More specifically, as illustrated in a side cross-sectional view of FIG. 8, in the signal processing circuits 41L and 41R, in a substrate layer 151 of a lowermost layer, the same element is formed in the same pattern, and a wiring layer 152 is provided in a layer thereabove. The wiring layer 152 includes wiring layers 161 and 162 from the bottom in the drawing.

The wiring layer 161 is formed in a region corresponding to the signal processing circuits 41L and 41R and is formed in the same wiring pattern that is formed by divided exposure. The general signal processing circuits 41L and 41R include only the substrate layer 151 and the wiring layer 161. However, in the present disclosure, furthermore, the wiring layer 162 having wiring patterns in which regions corresponding to the signal processing circuits 41L and 41R are different (left and right are different) according to one-shot exposure is provided as the uppermost layer.

That is, according to the wiring layer 161 having the same wiring pattern on which divided exposure is performed, a basic cell such as an AND circuit or an OR circuit is formed.

Since the wiring layer 162 has a wiring structure whose left and right are different according to one-shot exposure, when connection between basic cells such as an AND circuit or an OR circuit of the wiring layer 161 is changed, blocks having different functions are formed in the signal processing circuits 41L and 41R.

As a result, as described above, a wiring pattern can be independently formed in each of the signal processing circuits 41L and 41R. In the signal processing circuits 41L and 41R, it is possible to reduce the number of blocks that are in the standby state, that is, do not function. Therefore, it is possible to reduce wasted blocks and increase the number of blocks having a mounting function.

In particular, within the logic substrate 12 described with reference to FIG. 4, the wiring layers 162 of the logic units 103L and 103R have different wiring patterns. For example, a block that is adequate when provided on either side can be provided on either side.

Modified Example of First Embodiment

An example in which, on the substrate layer 151, the wiring layer 161 is formed in regions corresponding to the signal processing circuits 41L and 41R according to divided exposure, and in a layer thereabove, the wiring layer 162 having different wiring patterns is formed in regions corresponding to the signal processing circuits 41L and 41R according to one-shot exposure has been described above. Alternatively, in all wiring layers above the substrate layer 151, different wiring patterns are formed in regions corresponding to the signal processing circuits 41L and 41R according to one-shot exposure.

Figure 9:
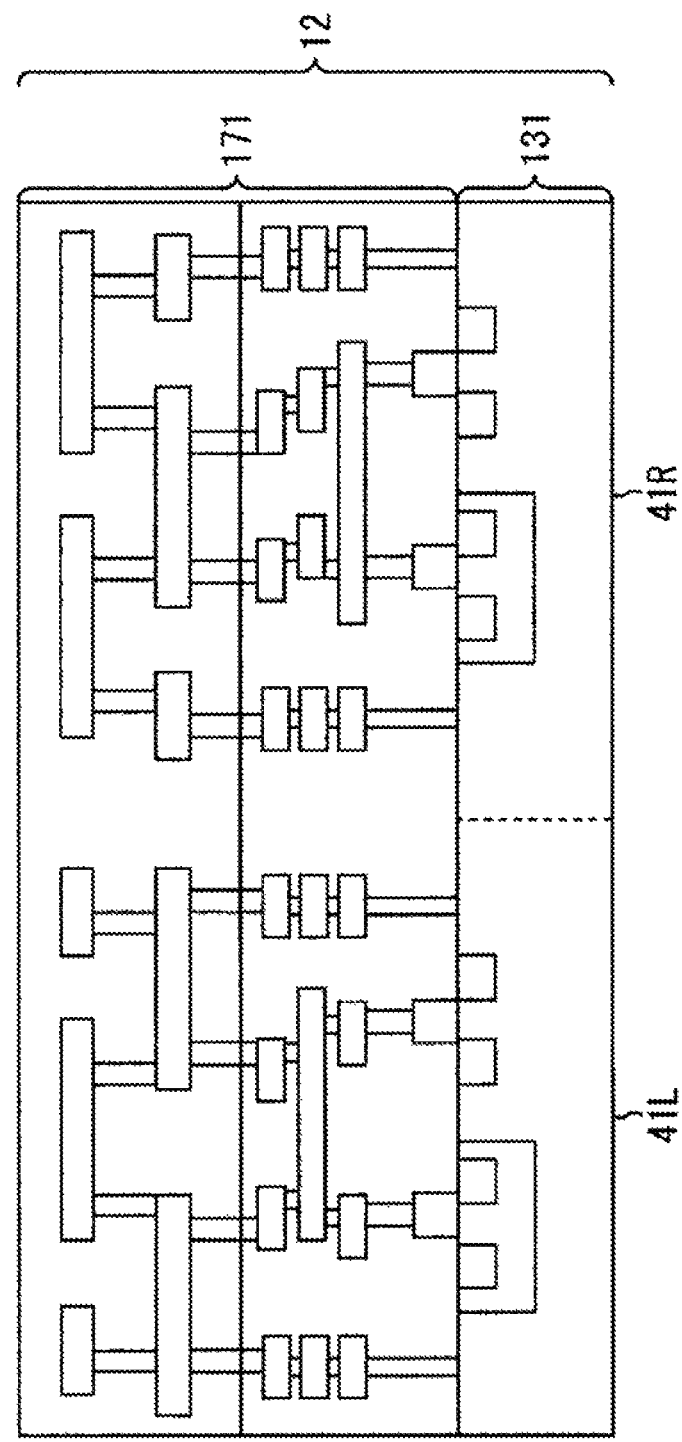
FIG. 9 is a diagram describing an example in which all wiring layers are wiring layers having different left and right wiring patterns formed by one-shot exposure.

As illustrated in FIG. 9, a wiring layer 171 formed according to one-shot exposure is formed in a layer above the substrate layer 131. That is, in FIG. 9, all wiring layers corresponding to the wiring layer 152 including the wiring layer 161 formed according to divided exposure and the wiring layer 162 formed according to one-shot exposure in FIG. 8 are configured by the wiring layer 171 in which different wiring patterns are formed in regions corresponding to the signal processing circuits 41L and 41R according to one-shot exposure.

In such a configuration, it is possible to mount a block having a function of a higher degree of freedom. In view of FIGS. 1, 8 and 9, it should be understood that the first substrate 11 includes a pixel circuit 21 having a pixel array unit 31. The second substrate 12 includes signal processing circuits 41L and 41R to process signals from the pixel array unit 31. The second substrate 12 includes a wiring layer (e.g., layer 162 in FIG. 8 or layer 171 in FIG. 9) with wiring regions R1 and R2 electrically connected to respective ones of the signal processing circuits 41L and 41R. Each signal processing circuit 41L and 41R has a same circuit pattern. The second substrate 12 and the first substrate 11 are stacked, and a wiring pattern of each wiring region R1 and R2 is different. In FIG. 8, the wiring layer 162 is a part of a wiring structure (e.g., layer 152) in the second substrate 12 and is stacked on another part of the wiring structure (e.g., layer 161). In FIG. 9, the wiring layer (e.g., layer 171) is an entire wiring structure in the second substrate 12. In FIGS. 8 and 9, a first one of the wiring regions (e.g., R1) corresponds to a first logic circuit (e.g., 41L) of the second substrate 12, and a second one of the wiring regions (e.g., R2) corresponds to a second logic circuit (e.g., 41R) of the second substrate 12. It should be understood that a function of each signal processing circuit 41L and 41R is changeable based on the wiring pattern of each wiring region R1 and R2 connected to each signal processing circuit 41L and 41R.

2. Second Embodiment

A case in which, in the wiring layer of the uppermost layer, in regions of the signal processing circuits 41L and 41R, different wiring patterns are formed according to one-shot exposure and thus different functions are implemented in the signal processing circuits 41L and 41R has been described above. However, the signal processing circuits 41L and 41R have, for example, two functions that are different from each other. According to Hi or Low in a 1-bit switching signal supplied through a signal line in each of the signal processing circuits 41, the two different functions may be switched.

Figure 10:
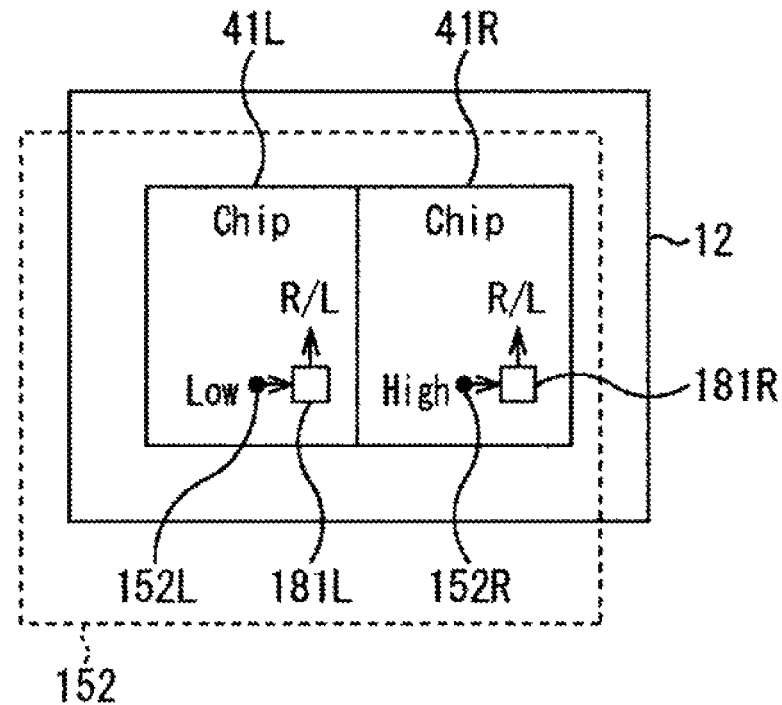
FIG. 10 is a diagram describing a configuration example of a solid-state imaging element according to a second embodiment in which an operation of the same signal processing circuits disposed at the left and right is switched.

For example, as illustrated in FIG. 10, in the signal processing circuits (Chips in the drawing) 41L and 41R having both functions of a left image process and a right image process, terminals 181L and 181R configured to receive a switching signal are provided. A switching signal in a fixed state from a signal line through terminals 152L and 152R formed by the wiring layer 152 in FIG. 8 formed according to a processing procedure is supplied to the terminals 181L and 181R.

When the switching signal is Low, the signal processing circuit 41 enables the function of the left image process and disables the function of the right image process. Similarly, when the switching signal is Hi, the signal processing circuit 41 enables the function of the right image process and disables the function of the left image process.

Therefore, when a configuration in which a switching signal of Low is supplied to the terminal 181L through the terminal 152L and a switching signal of Hi is supplied to the terminal 181R through the terminal 152R is provided, the signal processing circuit 41L in the drawing can function as a signal processing circuit configured to perform the left image process and the signal processing circuit 41R can function as a signal processing circuit configured to perform the right image process. In other words, the signal processing circuit 41L processes the signals from a first portion of the pixel array unit 31 (e.g., a portion corresponding to a left side of a captured image) at a different time than the signal processing circuit 41R processes the signals from a second portion of the pixel array unit 31 (e.g., a portion corresponding to a right side of a captured image).

Accordingly, when disposed in the logic substrate 12, if the signal processing circuit 41 is disposed without distinguishing the left and right, it is possible to implement a function according to a disposed position.

As a result, the preparation of the signal processing circuit 41 having different functions is unnecessary, time and effort for distinguishing disposition for each signal processing circuit 41 having different functions can be reduced, and thus it is possible to reduce a manufacturing cost.

It should be noted that there are two types, the signal processing circuits 41L and 41R, in the above, and thus the switching signal is a 1-bit signal. Alternatively, when one or more, for example, $2^n$, signal processing circuits 41 have $2^n$ types of different functions, an n-bit switching signal is switched and supplied according to the disposed position, and it is possible to switch a function according to each position.

First Modified Example of Second Embodiment

Figure 11:
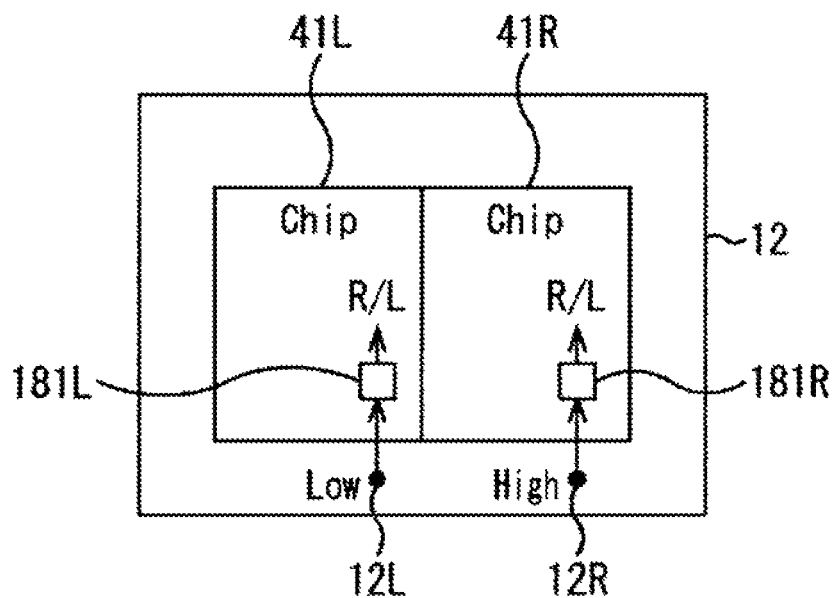
FIG. 11 is a diagram describing a first modified example of the second embodiment in which an operation of the same signal processing circuits disposed at the left and right is switched.

An example in which the switching signal supplied by the wiring layer 152 is supplied to the terminals 181L and 181R has been described. Alternatively, as illustrated in FIG. 11, signal lines through which the switching signal is supplied to the logic substrate 12 may be connected at bondings 12L and 12R.

In such a configuration, the signal processing circuits 41L and 41R can appropriately switch the function of the left image process and the function of the right image process according to Hi or Low of the fixed switching signal supplied through the bondings 12L and 12R.

Second Modified Example of Second Embodiment

Figure 12:
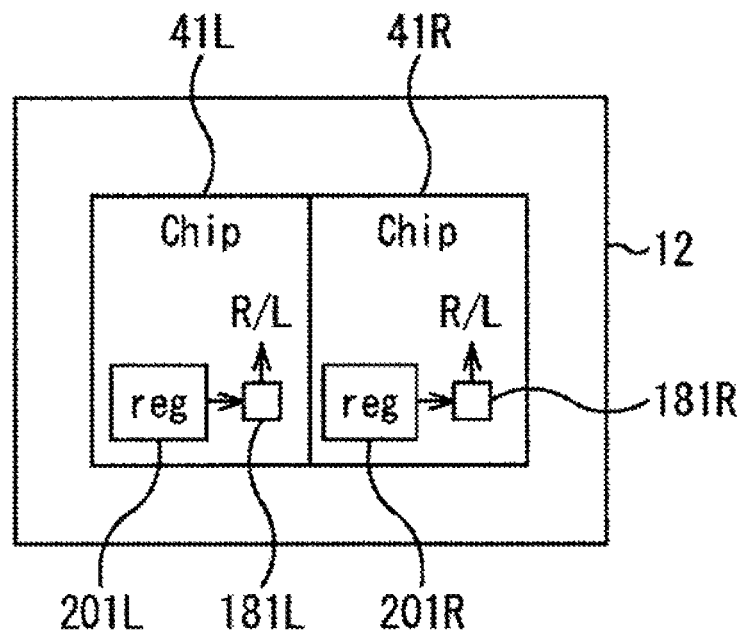
FIG. 12 is a diagram describing a second modified example of the second embodiment in which an operation of the same signal processing circuits disposed at the left and right is switched.

In addition, as illustrated in FIG. 12, registers 201L and 201R may be provided in the signal processing circuits 41L and 41R, respectively. The registers 201L and 201R write and store a predetermined value by a control device of a device that is not illustrated and output a switching signal of Hi or Low according to the stored value.

In such a configuration, the signal processing circuits 41L and 41R can switch a function based on Hi or Low of the switching signal stored in the registers (reg in the drawing) 201L and 201R through the terminals 181L and 181R.

Here, the registers 201L and 201R may store a fixed switching signal by a control device of a device that is not illustrated, for example, whenever the device starts.

Third Modified Example of Second Embodiment

Figure 13:
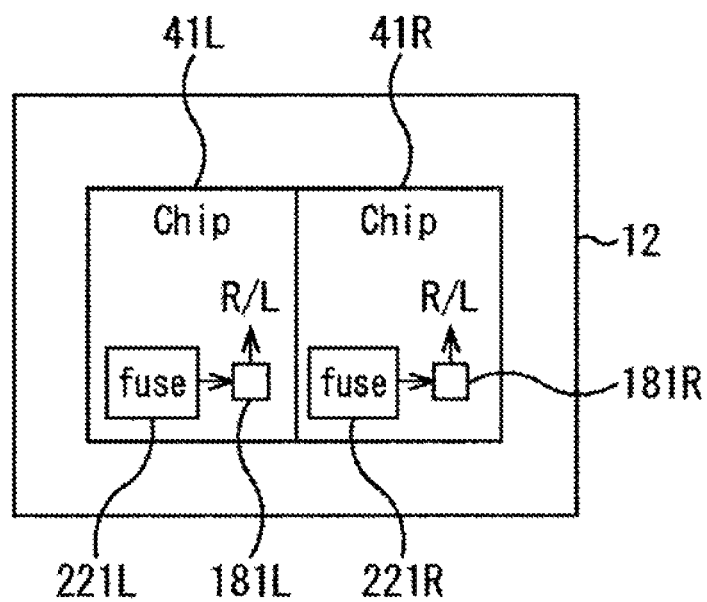
FIG. 13 is a diagram describing a third modified example of the second embodiment in which an operation of the same signal processing circuits disposed at the left and right is switched.

Further, as illustrated in FIG. 13, in the signal processing circuits 41L and 41R, eFuses (fuse in the drawing) 221L and 221R capable of switching an output value only once according to stress of electromagnetic waves including electricity or light such as ultraviolet light may be provided. The eFuses (fuse in the drawing) 221L and 221R store a predetermined value with each process according to stress of electromagnetic waves including electricity or light such as ultraviolet light and output a switching signal of Hi or Low according to the stored value.

In such a configuration, the signal processing circuits 41L and 41R can switch a function based on Hi or Low of the switching signal output by the eFuses 221L and 221R through the terminals 181L and 181R.

Fourth Modified Example of Second Embodiment

Figure 14:
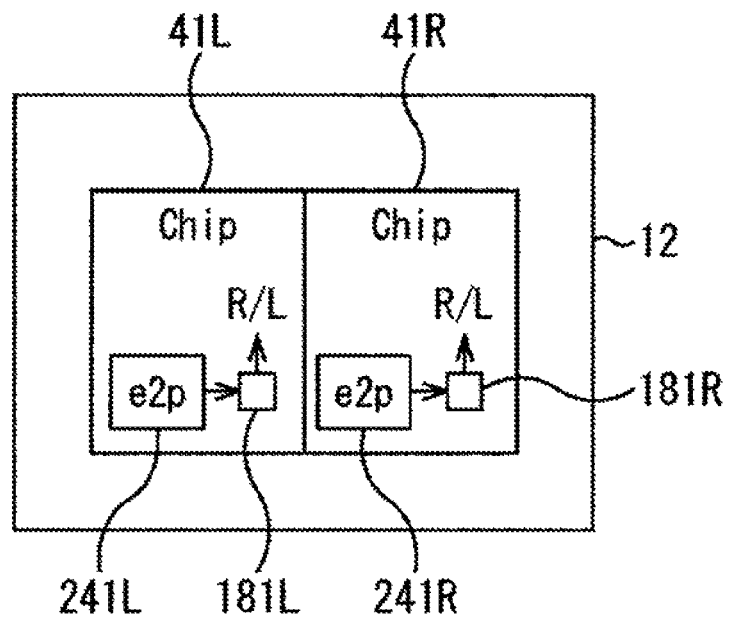
FIG. 14 is a diagram describing a fourth modified example of the second embodiment in which an operation of the same signal processing circuits disposed at the left and right is switched.

In addition, as illustrated in FIG. 14, in the signal processing circuits 41L and 41R, for example, Electrically Erasable Programmable Read-only Memories (EEPROMs) (e2p in the drawing) 241L and 241R serving as non-volatile memories capable of controlling an output value from the outside by a control device (not illustrated) may be provided. The EEPROMs 241L and 241R write and store a predetermined output value from the outside by a control device of a device that is not illustrated and output a switching signal of Hi or Low according to the stored output value.

In such a configuration, the signal processing circuits 41L and 41R can switch a function based on Hi or Low of the switching signal output by the EEPROMs 241L and 241R through the terminals 181L and 181R.

Fifth Modified Example of Second Embodiment

Figure 15:
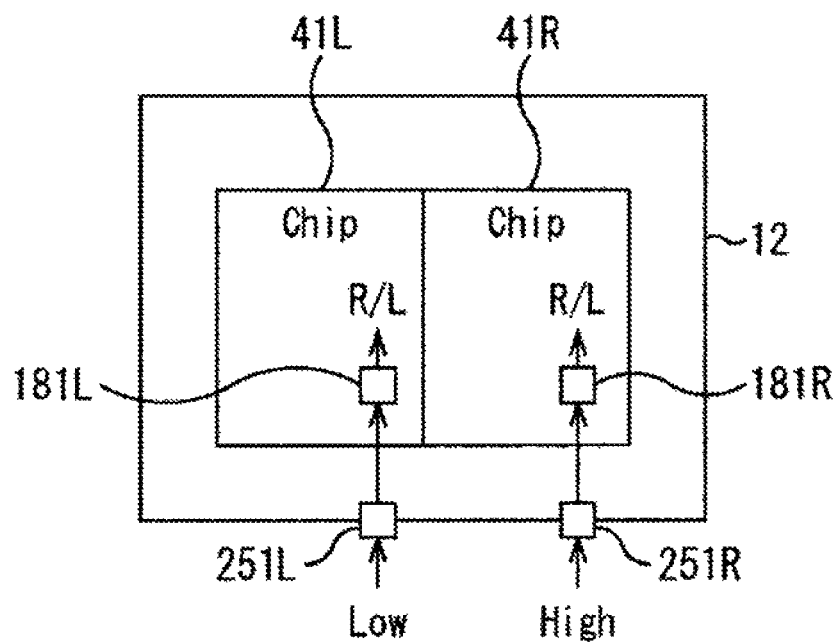
FIG. 15 is a diagram describing a fifth modified example of the second embodiment in which an operation of the same signal processing circuits disposed at the left and right is switched.

Further, as illustrated in FIG. 15, external terminals 251L and 251R may be provided in the signal processing circuits 41L and 41R, respectively.

In such a configuration, the signal processing circuits 41L and 41R can switch a function based on Hi or Low of the switching signal supplied to the terminals 181L and 181R through the external terminals 251L and 251R.

3. Third Embodiment

A configuration in which different functions are implemented in the signal processing circuits 41L and 41R has been described above. Alternatively, in order to implement an operation in which the signal processing circuits 41L and 41R are synchronized, the same reference clock signal may be supplied to the signal processing circuits 41L and 41R.

Figure 16:
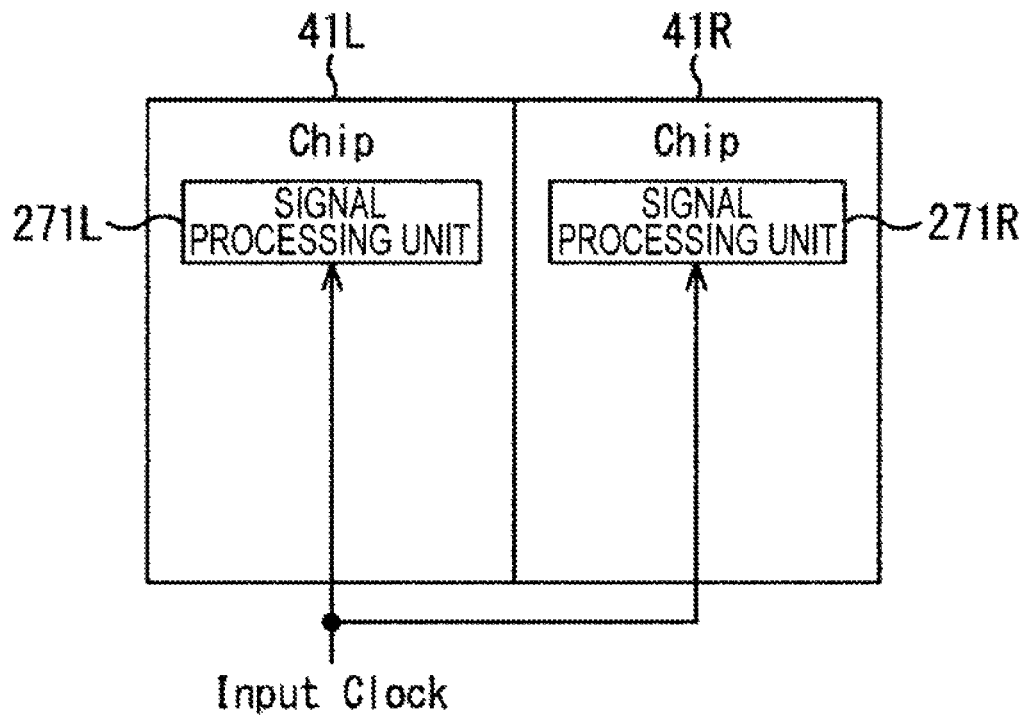
FIG. 16 is a diagram describing a configuration example of a third embodiment of the present disclosure in which a reference clock signal supplied to left and right signal processing circuits is applied.

That is, as illustrated in FIG. 16, when signal processing units 271L and 271R having the same function are provided in the signal processing circuits 41L and 41R, respectively, a reference clock signal (Input Clock in the drawing) is supplied to the signal processing circuits 41L and 41R. It should be noted that the term "the signal processing units 271L and 271R" generally refers to blocks that execute various functions performed by the above-described signal processing circuits 41L and 41R.

Accordingly, in the signal processing circuits 41L and 41R, the signal processing units 271L and 271R can execute signal processing based on the supplied reference clock signal.

As a result, since the signal processing units 271L and 271R execute an operation using the reference clock signal, it is possible to synchronize processes, for example, achieve left and right synchronization of a captured image, suppress image quality reduction caused by non-synchronization of signal processing performed by left and right image groups, and achieve high image quality.

First Modified Example of Third Embodiment

While an example in which the signal processing units 271L and 271R use the supplied reference clock signal without change has been described above, a clock signal multiplied by a reference clock signal at a predetermined ratio using a multiplication function including a phase locked loop (PLL) may be used.

Figure 17:
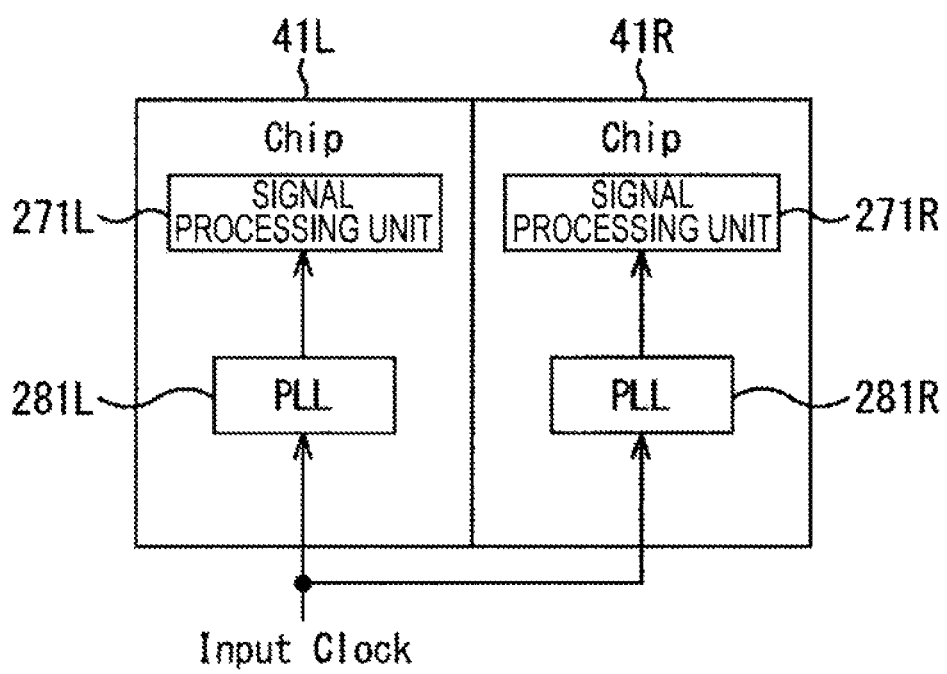
FIG. 17 is a diagram describing a first modified example of a third embodiment of the present disclosure in which a reference clock signal supplied to left and right signal processing circuits is applied.

FIG. 17 shows a configuration example in which the signal processing units 271L and 271R having the same function are provided in the signal processing circuits 41L and 41R, respectively, the reference clock signal is supplied to the signal processing circuits 41L and 41R and multiplier units (PLL in the drawing) 281L and 281R are provided at a previous stage of the signal processing units 271L and 271R.

As a result, since the signal processing units 271L and 271R execute an operation using a clock signal multiplied by the reference clock signal by the multiplier units 281L and 281R, it is possible to synchronize processes, and for example, achieve left and right synchronization of a captured image, and achieve high image quality.

Second Modified Example of Third Embodiment

While an example in which the reference clock signal is supplied to the signal processing circuits 41L and 41R has been described above, the reference clock signal may be supplied to any of the signal processing circuits 41L and 41R, and the signal processing circuit 41 to which the reference clock signal is supplied may supply the reference clock signal to the signal processing circuit 41 to which no reference clock signal is supplied.

Figure 18:
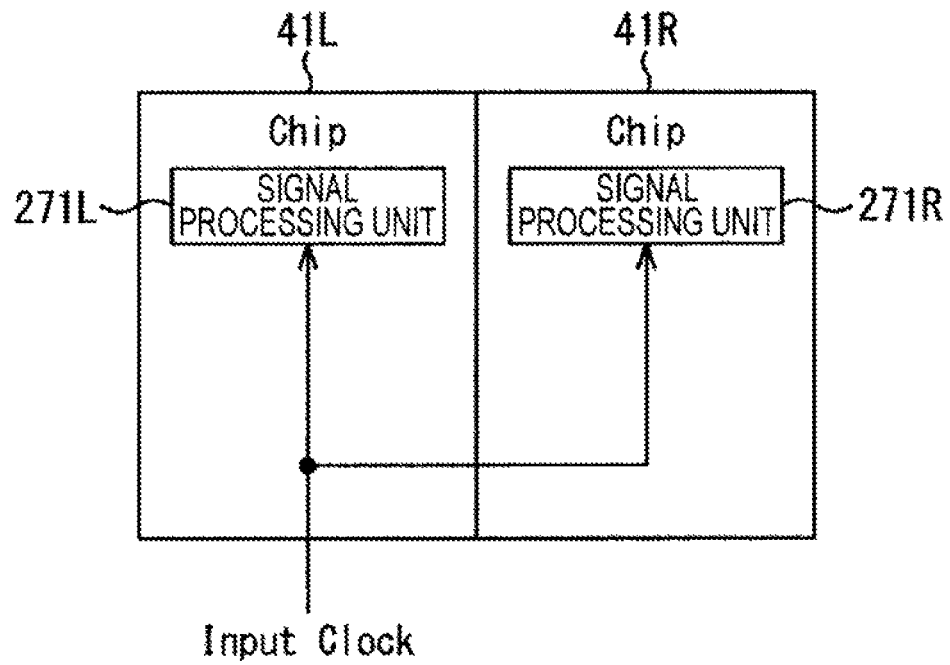
FIG. 18 is a diagram describing a second modified example of a third embodiment of the present disclosure in which a reference clock signal supplied to left and right signal processing circuits is applied.

That is, as illustrated in FIG. 18, the reference clock signal is supplied to the signal processing circuit 41L, and the signal processing circuit 41L to which the reference clock signal is supplied may supply the reference clock signal to the signal processing circuit 41R to which no reference clock signal is supplied.

In such a configuration, for the same reason as described above, it is possible to achieve high image quality and reduce the number of external terminals.

It should be noted that, while an example in which the signal processing circuit 41L receives the supplied reference clock signal and supplies the result to the signal processing circuit 41R has been described in FIG. 18, the signal processing circuit 41R may receive the supplied reference clock signal and supply the signal to the signal processing circuit 41L. In addition, when two or more signal processing circuits 41 are provided, any of the signal processing circuits 41 may receive the supplied reference clock signal and supply the reference clock signal to the other signal processing circuit 41 to which no reference clock signal is supplied.

Third Modified Example of Third Embodiment

An example in which the reference clock signal is supplied to any of the signal processing circuits 41L and 41R, the signal processing circuit 41 to which the reference clock signal is supplied supplies the reference clock signal to the signal processing circuit 41 to which no reference clock signal is supplied has been described above.

However, further, the reference clock signal is supplied to any of the signal processing circuits 41L and 41R, and additionally, the signal processing circuit 41 to which the reference clock signal is supplied performs multiplication of the reference clock signal. Then, a clock signal multiplied by the reference clock signal may be supplied to the signal processing circuit 41 to which no reference clock signal is supplied.

Figure 19:
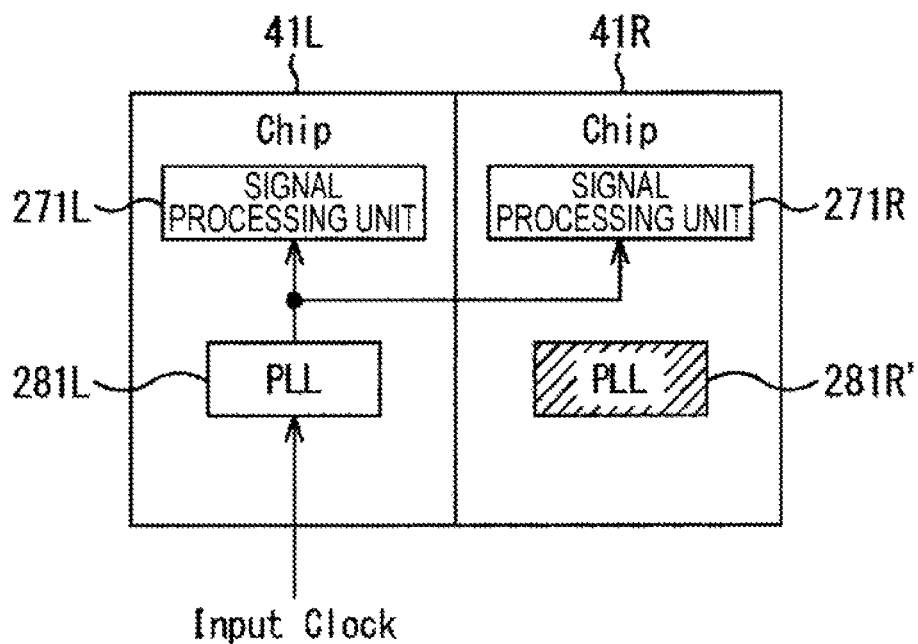
FIG. 19 is a diagram describing a third modified example of a third embodiment of the present disclosure in which a reference clock signal supplied to left and right signal processing circuits is applied.

That is, as illustrated in FIG. 19, the reference clock signal is supplied to the signal processing circuit 41L. In the signal processing circuit 41L to which the reference clock signal is supplied, the multiplier unit 281L performs multiplication of the reference clock signal. Then, a clock signal multiplied by the reference clock signal is supplied to the signal processing circuit 41R to which no reference clock signal is supplied.

In such a configuration, for the same reason as described above, it is possible to achieve high image quality and reduce the number of external terminals.

It should be noted that, while an example in which the signal processing circuit 41L receives the supplied reference clock signal, performs multiplication and then supplies the result to the signal processing circuit 41R has been described in FIG. 19, the signal processing circuit 41R may receive the supplied reference clock signal, perform multiplication and then supply the result to the signal processing circuit 41L. In addition, when two or more signal processing circuits 41 are provided, any of the signal processing circuits 41 may receive the supplied reference clock signal, perform multiplication, and supply a clock signal multiplied by the reference clock signal to the other signal processing circuit 41.

In addition, a multiplier unit 281R' indicated by a shaded portion in FIG. 19 indicates that the multiplier unit 281R in FIG. 17 is in the standby state.

Fourth Modified Example of Third Embodiment

While an example in which any of a reference clock signal and a clock signal multiplied by a reference clock signal is supplied to any of the signal processing circuits 41L and 41R has been described above, these may be supplied in a mixed state.

Figure 20:
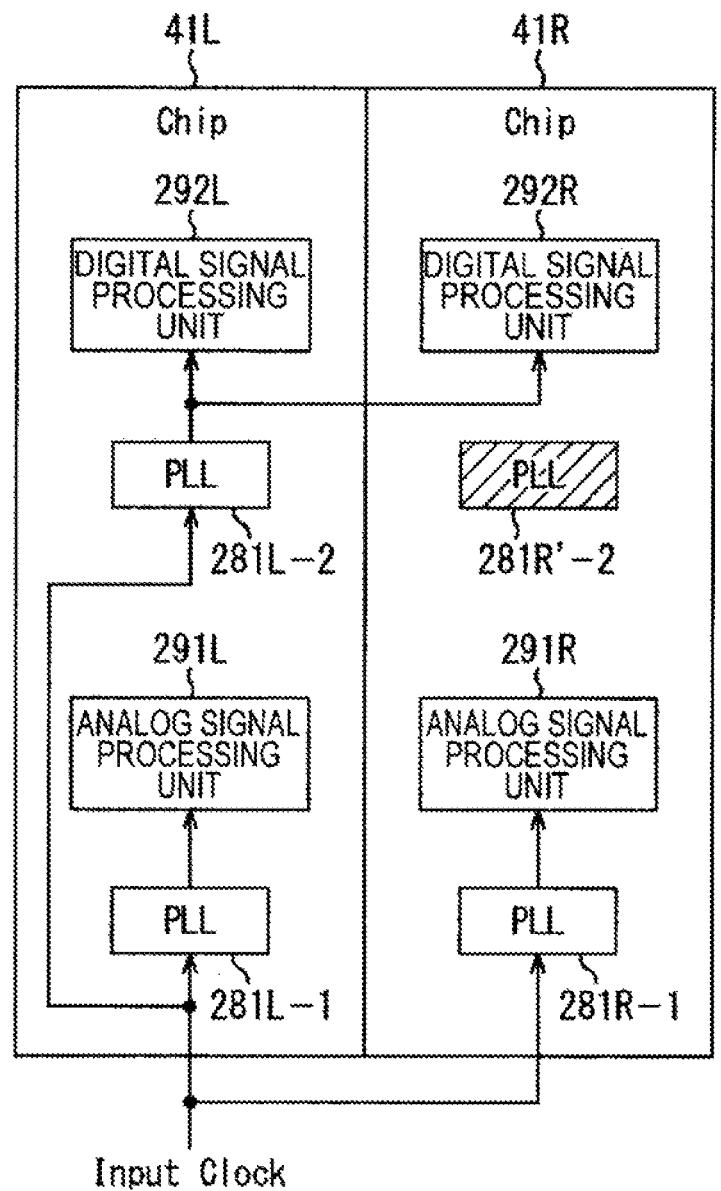
FIG. 20 is a diagram describing a fourth modified example of a third embodiment of the present disclosure in which a reference clock signal supplied to left and right signal processing circuits is applied.

That is, as illustrated in FIG. 20, an analog signal processing unit 291L, a digital signal processing unit 292L, and multiplier units 281L-1 and 281L-2 are provided in the signal processing circuit 41L. In addition, in the signal processing circuit 41R, an analog signal processing unit 291R, a digital signal processing unit 292R, and the multiplier unit 281R are provided.

Therefore, the signal processing circuit 41L receives the supplied reference clock signal, the multiplier unit 281L-1 performs multiplication of the reference clock signal and supplies the result to the digital signal processing units 292L and 292R, and the multiplier unit 281L-2 performs multiplication of the reference clock signal and supplies the result to the analog signal processing unit 291L.

On the other hand, the signal processing circuit 41R receives the supplied reference clock signal, and the multiplier unit 281R performs multiplication of the reference clock signal and supplies the result to the analog signal processing unit 291R.

In such a configuration, in the signal processing circuit 41R, the reference clock signal is supplied from the outside and a clock signal multiplied by the reference clock signal by a signal processing circuit 441L is supplied.

In any case, since it is possible to implement an operation in which the analog signal processing units 291L and 291R and the digital signal processing units 292L and 292R are synchronized, it is possible to achieve high image quality.

It should be noted that a configuration in which the configuration of the signal processing circuits 41L and 41R in FIG. 20 is replaced may be used. In addition, a multiplier unit 281R'-2 indicated by a shaded portion in FIG. 20 indicates that the multiplier unit 281R-2 corresponding to the multiplier unit 281L-2 is in the standby state.

4. Fourth Embodiment

While an example in which the supplied reference clock signal is received and operations of the signal processing units of the signal processing circuits 41L and 41R are synchronized has been described above, references of ADC groups provided in the signal processing circuits 41L and 41R are aligned, and therefore, a difference of characteristics according to the ADC may be corrected.

Figure 21:
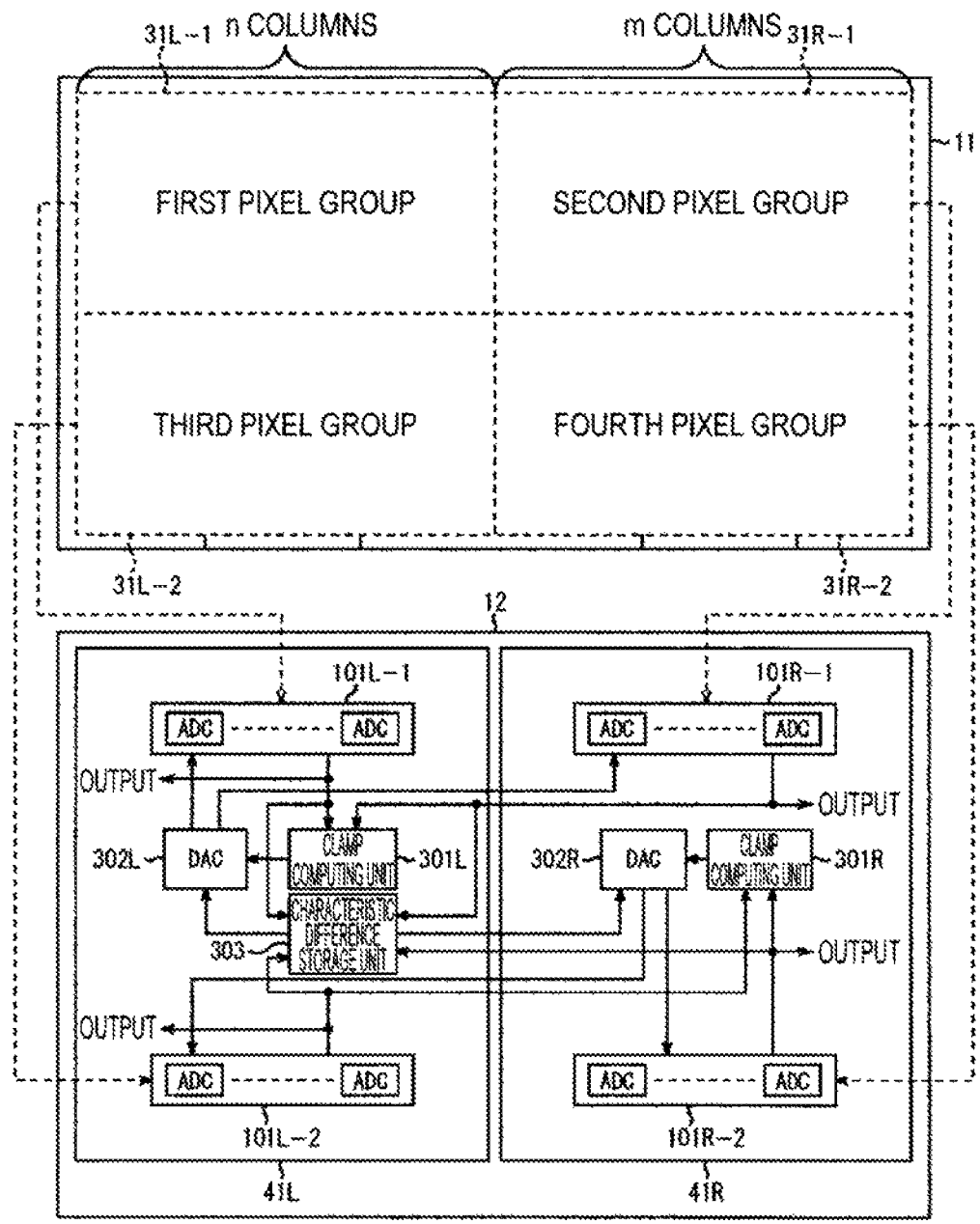
FIG. 21 is a diagram describing a configuration example of a fourth embodiment of the present disclosure in which a reference of an ADC is corrected by a stray capacitance of left and right signal processing circuits.

FIG. 21 shows a configuration example of the signal processing circuits 41L and 41R in which reference voltages (references) of ADC groups (groups of a plurality of AD converters 81) provided in the signal processing circuits 41L and 41R are aligned, and thus a difference of characteristics according to the AD converter 81 is corrected.

The upper part in FIG. 21 shows the pixel array unit 31 on the pixel substrate 11 that is used as a processing range for each of the signal processing circuits 41L and 41R and that includes the left half of n columns and the right half of m columns, and pixel groups formed by dividing the region into upper and lower half processing regions. In this case, the upper left is a first pixel group 31L-1, the upper right is a second pixel group 31R-1, the lower left is a third pixel group 31L-2, and the lower right is a fourth pixel group 31R-2.

In addition, in the logic substrate 12, in the signal processing circuit 41L, the AD converting unit (ADC group) 101L-1 and the AD converting unit (ADC group) 101L-2 described with reference to FIG. 4, and a clamp computing unit 301L, a digital analog converting unit (DAC) 302L, and a characteristic difference storage unit 303 are provided.

Further, in the signal processing circuit 41R, an AD converting unit (ADC group) 101R-1, an AD converting unit (ADC group) 101R-2, a clamp computing unit 301R and a DAC 302R are provided.

The AD converting unit (ADC group) 101L-1, the AD converting unit (ADC group) 101R-1, the AD converting unit (ADC group) 101L-2, and the AD converting unit (ADC group) 101R-2 perform analog digital conversion of pixel signals of the first pixel group 31L-1, the second pixel group 31R-1, the third pixel group 31L-2, and the fourth pixel group 31R-2 and output the converted signals.

Therefore, the AD converting unit (ADC group) 101L-1 and the AD converting unit (ADC group) 101R-1 supply the pixel signals of the pixel group of the upper left and right half in the pixel array unit 31 that are converted into digital signals to the clamp computing unit 301L. In addition, the AD converting unit (ADC group) 101L-2 and the AD converting unit (ADC group) 101R-2 supply the pixel signals of the pixel group of the lower left and right half in the pixel array unit 31 that are converted into digital signals to the clamp computing unit 301R. In this case, the AD converting unit (ADC group) 101L-1, the AD converting unit (ADC group) 101R-1, the AD converting unit (ADC group) 101L-2 and the AD converting unit (ADC group) 101R-2 output the pixel signals to subsequent stages (described as "output" in the drawing). Here, the output pixel signal is subjected to parallel-to-serial conversion and is output as a pixel signal that is output by the signal processing unit 65 of FIG. 3 described above.

The clamp computing unit 301L computes reference levels based on pixel signals of pixels of a light-blocking region (not illustrated) provided in a peripheral region of the first pixel group 31L-1 and the second pixel group 31R-1 of the pixel array unit 31, which are converted into digital signals by the AD converting unit (ADC group) 101L-1 and the AD converting unit (ADC group) 101R-1. Therefore, the clamp computing unit 301L outputs any of an average value, a minimum value and a maximum value of the reference levels to the DAC 302L as a correction level. The clamp computing unit 301L repeats a similar process in real time and repeatedly outputs the correction level.

Similarly, the clamp computing unit 301R computes reference levels based on pixel signals of pixels of a light-blocking region (not illustrated) provided in a peripheral region of the third pixel group 31L-2 and the fourth pixel group 31R-2 of the pixel array unit 31, which are converted into digital signals by the AD converting unit (ADC group) 101L-2 and the AD converting unit (ADC group) 101R-2. Therefore, the clamp computing unit 301R outputs any of an average value, a minimum value and a maximum value of the reference levels to the DAC 302R as a correction level. The clamp computing unit 301R repeats a similar process in real time and repeatedly outputs the correction level.

The DAC 302L supplies a signal of the correction level supplied by the clamp computing unit 301L to the AD converting unit (ADC group) 101L-1 and the AD converting unit (ADC group) 101R-1 as a reference voltage (reference) that is converted from a digital signal into an analog signal.

In this case, the DAC 302L outputs the reference voltage (reference) while a gain is controlled so that mutual characteristic differences are corrected by the characteristic difference storage unit 303.

The DAC 302R supplies a signal of the correction level supplied by the clamp computing unit 301R to the AD converting unit (ADC group) 101L-2 and the AD converting unit (ADC group) 101R-2 as a reference voltage (reference) that is converted from a digital signal into an analog signal. In this case, the DAC 302R outputs the reference voltage (reference) while a gain is controlled so that mutual characteristic differences are corrected by the characteristic difference storage unit 303.

That is, the DACs 302L and 302R function as the above-described reference voltage generating unit 82L in FIG. 2.

When power supply of the solid-state imaging element 1 is turned off, the characteristic difference storage unit 303 images all pixels of the pixel array unit 31 as light-blocking pixels, and stores a difference thereof as a characteristic difference based on pixel signals that are converted into digital signals by the AD converting unit (ADC group) 101L-1 and the AD converting unit (ADC group) 101R-1, and the AD converting unit (ADC group) 101L-2 and the AD converting unit (ADC group) 101R-2.

More specifically, the characteristic difference storage unit 303 calculates and stores an output difference between the AD converting unit (ADC group) 101L-1 and the AD converting unit (ADC group) 101R-1 and an output difference between the AD converting unit (ADC group) 101L-2 and the AD converting unit (ADC group) 101R-2 as a characteristic difference between the AD converting unit (ADC group) 101L-1 and the AD converting unit (ADC group) 101R-1 and a characteristic difference between the AD converting unit (ADC group) 101L-2 and the AD converting unit (ADC group) 101R-2. Therefore, the characteristic difference storage unit 303 controls gains of the DACs 302L and 302R to cancel the stored characteristic difference.

The clamp computing unit 301L obtains a correction level for controlling reference voltages (references) of the AD converting unit (ADC group) 101L-1 and the AD converting unit (ADC group) 101R-1 according to computation and outputs the obtained level.

Similarly, the clamp computing unit 301R obtains a correction level for controlling reference voltages (references) of the AD converting unit (ADC group) 101L-2 and the AD converting unit (ADC group) 101R-2 according to computation and outputs the obtained level.

Therefore, almost the same reference voltage (reference) is supplied to the AD converting unit (ADC group) 101L-1 and the AD converting unit (ADC group) 101R-1. Accordingly, the balance of development of color of the first pixel group 31L-1 and the second pixel group 31R-1 is regulated and substantially white balance is adjusted. Therefore, characteristics of the AD converting unit (ADC group) 101L-1 and the AD converting unit (ADC group) 101R-1 are regulated.

Similarly, almost the same reference voltage (reference) is supplied to the AD converting unit (ADC group) 101L-2 and the AD converting unit (ADC group) 101R-2. Accordingly, the balance of development of color of the third pixel group 31L-2 and the fourth pixel group 31R-2 is regulated and substantially white balance is adjusted. Therefore, characteristics of the AD converting unit (ADC group) 101L-2 and the AD converting unit (ADC group) 101R-2 are regulated.

However, the AD converting unit (ADC group) 101L-1 and the AD converting unit (ADC group) 101R-1 and the AD converting unit (ADC group) 101L-2 and the AD converting unit (ADC group) 101R-2 are provided in the signal processing circuits 41L and 41R, respectively, as illustrated in FIG. 21. Due to differences thereof, parasitic capacitances are not the same and different characteristics are generally provided.

Therefore, in the first pixel group 31L-1 and the second pixel group 31R-1 and the third pixel group 31L-2 and the fourth pixel group 31R-2, development of color is regulated between pixels in regions thereof. However, characteristics between a first ADC group including the AD converting unit (ADC group) 101L-1 and the AD converting unit (ADC group) 101R-1 and a second ADC group including the AD converting unit (ADC group) 101L-2 and the AD converting unit (ADC group) 101R-2 are different. As a result, there is a difference albeit in development of color between the first pixel group 31L-1 and the second pixel group 31R-1 and between the third pixel group 31L-2 and the fourth pixel group 31R-2, and thus there is a risk of image quality being reduced.

Therefore, the characteristic difference storage unit 303 images a black image by setting all pixels in a light-blocking state immediately before power supply is turned off, sets gains of the DACs 302L and 302R at this time to a maximum value, measures and stores an output difference between the first pixel group 31L-1 and the second pixel group 31R-1 and the third pixel group 31L-2 and the fourth pixel group 31R-2 as a characteristic difference. The characteristic difference is a difference that is generated by a difference of characteristics between ADC groups, the first ADC group including the AD converting unit (ADC group) 101L-1 and the AD converting unit (ADC group) 101R-1 and the second ADC group including the AD converting unit (ADC group) 101L-2 and the AD converting unit (ADC group) 101R-2. When the characteristic difference is stored according to a characteristic difference correcting process which will be described with reference to FIG. 23, the characteristic difference storage unit 303 adjusts a gain between the DACs 302L and 302R to correct the stored characteristic difference and outputs a reference voltage (reference) in an ADC characteristic difference storing process which will be described with reference to FIG. 22.

Accordingly, when the characteristic difference between ADC groups is corrected, it is possible to suppress a difference in development of color that occurs between the first pixel group 31L-1 and the second pixel group 31R-1 and the third pixel group 31L-2 and the fourth pixel group 31R-2 within the pixel array unit 31, and it is possible to implement a high-speed process according to the plurality of ADC groups.

It should be noted that the term "characteristic difference" includes an offset component and a gain component. The offset component indicates a deviation of reference levels in digital signals output by the AD converting unit (ADC group) 101L-1, the AD converting unit (ADC group) 101R-1, the AD converting unit (ADC group) 101L-2, and the AD converting unit (ADC group) 101R-2, which are adjusted by the clamp computing units 301L and 301R.

In addition, the gain component indicates a deviation of linearity with respect to correction levels supplied by the clamp computing units 301L and 301R of the first ADC group including the AD converting unit (ADC group) 101L-1 and the AD converting unit (ADC group) 101R-1 and the second ADC group including the AD converting unit (ADC group) 101L-2 and the AD converting unit (ADC group) 101R-2, which are adjusted by the clamp computing units 301L and 301R.

ADC Group Characteristic Difference Correcting Process

Figure 22:
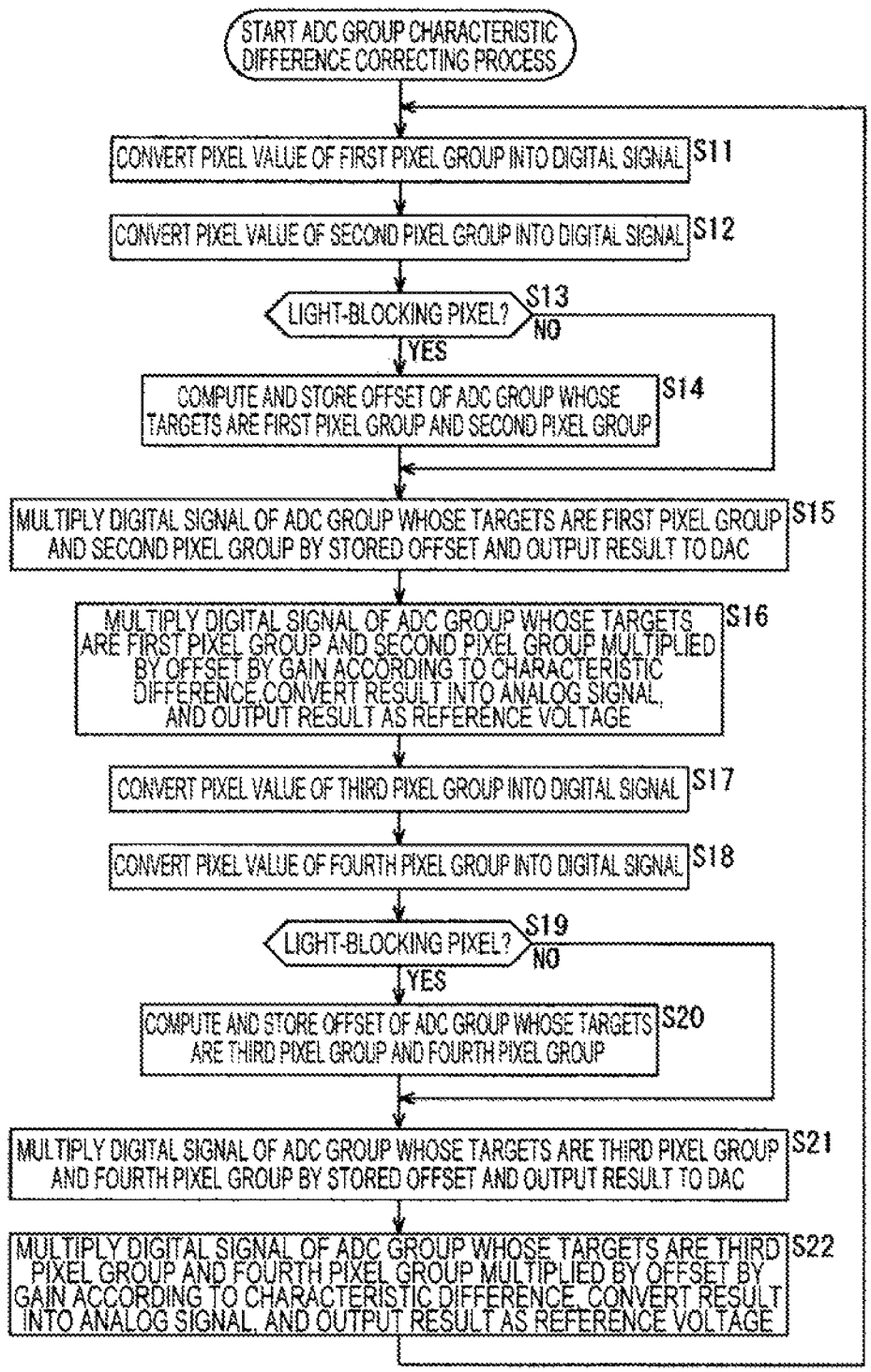
FIG. 22 is a flowchart describing an ADC characteristic difference correcting process performed by a solid-state imaging element of FIG. 21.

Next, a process of correcting a difference between ADC groups performed by the signal processing circuits 41L and 41R of FIG. 21 will be described with reference to a flowchart of FIG. 22. It should be noted that, in the process, it is assumed that pixel signals obtained from analog signals that are sequentially generated by photodiodes of pixels within the pixel array unit 31 according to photoelectric conversion are sequentially supplied.

In Step S11, the AD converting unit (ADC group) 101L-1 converts an analog signal supplied by the first pixel group 31L-1 into a digital signal, supplies the result to the clamp computing unit 301L and the characteristic difference storage unit 303, and outputs the result as a pixel signal.

In Step S12, the AD converting unit (ADC group) 101R-1 converts an analog signal supplied by the second pixel group 31R-1 into a digital signal, supplies the result to the clamp computing unit 301L and the characteristic difference storage unit 303, and outputs the result as a pixel signal.

In Step S13, the clamp computing unit 301L determines whether a current pixel is a light-blocking pixel provided in a peripheral region of the pixel array unit 31, and when it is determined as a light-blocking pixel, the process advances to Step S14.

In Step S14, the clamp computing unit 301L computes and stores an offset based on a reference level according to pixel signals obtained from digital signals output by the AD converting unit (ADC group) 101L-1 and the AD converting unit (ADC group) 101R-1 serving as the first ADC group whose targets are the first pixel group 31L-1 and the second pixel group 31R-1. That is, pixel values supplied from light-blocking pixels should be supplied as signals of reference levels. However, according to characteristics of the AD converting unit (ADC group) 101L-1 and the AD converting unit (ADC group) 101R-1, there may be a pixel value that is deviated from the reference level. Therefore, the clamp computing unit 301L calculates an amount of the deviation as an offset and stores the offset for a plurality of pixels.

In Step S15, the clamp computing unit 301L multiplies an average value, a minimum value or a maximum value of the stored offsets of the plurality of pixels by pixel signals of the AD converting unit (ADC group) 101L-1 and the AD converting unit (ADC group) 101R-1 to set a correction level and outputs the result to the DAC 302L. That is, the clamp computing unit 301L sets a correction level in order for pixel values of light-blocking pixels to be reference levels and for a reference voltage (reference) from the DAC 302L to be deviated only by the stored offset, and outputs the result to the DAC 302L. It should be noted that, in Step S13, when it is determined that a current pixel is not a light-blocking pixel, the process of Step S14 is skipped.

In Step S16, the DAC 302L converts a digital signal of the correction level supplied by the clamp computing unit 301L into an analog signal, and outputs the converted signal to the AD converting unit (ADC group) 101L-1 and the AD converting unit (ADC group) 101R-1 serving as the first ADC group whose targets are the first pixel group 31L-1 and the second pixel group 31R-1 as a reference voltage (a reference).

In Step S17, the AD converting unit (ADC group) 101L-2 converts an analog signal supplied by the third pixel group 31L-2 and the fourth pixel group 31R-2 into a digital signal, supplies the converted signal to the clamp computing unit 301R and the characteristic difference storage unit 303, and outputs the result as a pixel signal.

In Step S18, the AD converting unit (ADC group) 101R-2 converts an analog signal supplied by the third pixel group 31L-2 and the fourth pixel group 31R-2 into a digital signal, supplies the converted signal to the clamp computing unit 301R and the characteristic difference storage unit 303, and outputs the result as a pixel signal.

In Step S19, the clamp computing unit 301R determines whether a current pixel is a light-blocking pixel that is provided in a peripheral region of the pixel array unit 31, and when it is determined as a light-blocking pixel, the process advances to Step S20.

In Step S20, the clamp computing unit 301R computes an offset based on a reference level according to pixel signals obtained from digital signals output by the AD converting unit (ADC group) 101L-2 and the AD converting unit (ADC group) 101R-2 serving as the ADC group whose targets are the third pixel group 31L-2 and the fourth pixel group 31R-2 and stores the offset for a plurality of pixels.

In Step S21, the clamp computing unit 301R multiplies an average value, a minimum value or a maximum value of the store offsets of the plurality of pixels by pixel signals of the AD converting unit (ADC group) 101L-2 and the AD converting unit (ADC group) 101R-2 to set a correction level and outputs the result to the DAC 302R. It should be noted that, in Step S19, when it is determined that a current pixel is not a light-blocking pixel, the process of Step S20 is skipped.

In Step S22, the DAC 302R converts a digital signal of the correction level supplied by the clamp computing unit 301R into an analog signal and outputs the converted signal to the AD converting unit (ADC group) 101L-2 and the AD converting unit (ADC group) 101R-2 serving as the second ADC group whose targets are the third pixel group 31L-2 and the fourth pixel group 31R-2 as a reference voltage (reference). In this case, the DAC 302R outputs the reference voltage (the reference) multiplied by a gain according to the characteristic difference (gain component) stored in the characteristic difference storage unit 303.

According to the above-described process, when a pixel signal outside the light-blocking region is supplied, based on the characteristic difference of the AD converting unit (ADC group) 101L-2 and the AD converting unit (ADC group) 101R-2 using the AD converting unit (ADC group) 101L-1 and the AD converting unit (ADC group) 101R-1 as references, which is stored in the characteristic difference storage unit 303, a gain of the DAC 302R is adjusted and the reference voltage is output. Therefore, the reference voltage (reference) is supplied to the AD converting unit (ADC group) 101L-2 and the AD converting unit (ADC group) 101R-2 such that a gain component of characteristic differences of the first ADC group including the AD converting unit (ADC group) 101L-1 and the AD converting unit (ADC group) 101R-1 and the second ADC group including the AD converting unit (ADC group) 101L-2 and the AD converting unit (ADC group) 101R-2 is absorbed.

In this case, since the correction level set based on the offset is supplied to the DACs 302L and 302R, the offset component in the characteristic difference is also corrected. That is, the offset component in the characteristic component is independently corrected in the first pixel group 31L-1 and the second pixel group 31R-1, and the third pixel group 31L-2 and the fourth pixel group 31R-2 by the clamp computing units 301L and 301R. In addition, the gain component in the characteristic component is relatively corrected based on the characteristic difference obtained as the output difference between the first pixel group 31L-1 and the second pixel group 31R-1, and the third pixel group 31L-2 and the fourth pixel group 31R-2 by the characteristic difference storage unit 303.

As a result, when an operation is performed for the characteristic difference between different ADC groups to be absorbed, it is possible to implement development of appropriate colors of the pixel array unit 31 as a whole, and it is possible to achieve high image quality. In addition, since it is possible to dynamically correct the characteristic difference (in particular, the offset component), it is possible to maintain development of appropriate colors for a long time, and ensure image quality for a long time. In addition, since the characteristic difference between ADC groups is caused by a change in the parasitic capacitance due to the layout, the layout of the ADC group has a symmetrical basis so far and is adjusted by other know-how and trial and error. However, since the layout may not be influenced by the parasitic capacitance, it is possible to increase degrees of freedom of the ADC layout. It should be noted that a process of storing the characteristic difference will be described below with reference to FIG. 23.

In addition, when a pixel signal of the light-blocking region is supplied, the offset component serving as the characteristic difference of the AD converting unit (ADC group) 101L-1, the AD converting unit (ADC group) 101R-1, the AD converting unit (ADC group) 101L-2 and the AD converting unit (ADC group) 101R-2 is computed and adjusted and the reference voltage (reference) is dynamically corrected.

Characteristic Difference Storing Process

Figure 23:
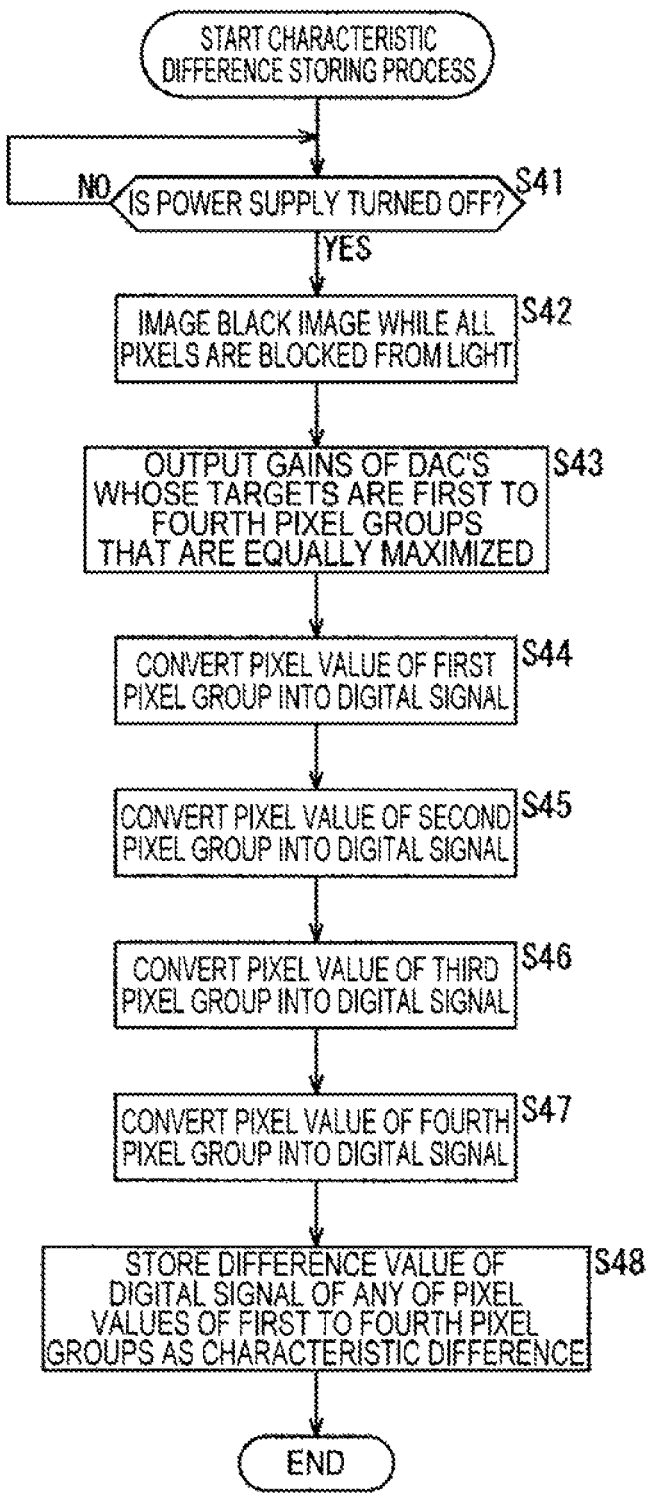
FIG. 23 is a flowchart describing a characteristic difference storing process performed by the solid-state imaging element of FIG. 21.

Next, a characteristic difference storing process will be described with reference to a flowchart of FIG. 23.

In Step S41, a control unit (not illustrated) configured to control an operation of the pixel array unit 31 determines whether an operation in which power supply of the solid-state imaging element 1 is turned off is performed and repeats a similar process until it is determined to be turned off. Then, in Step S41, when it is determined that power supply is turned off, the process advances to Step S42.

In Step S42, the pixel array unit 31 images a black image while the entire region is blocked from light. That is, all pixels are light-blocking pixels and can be processed as light-blocking pixels while any of the pixels is read.

In Step S43, the characteristic difference storage unit 303 increases (or alternatively, maximizes) gains of the DACs 302L and 302R and supplies reference voltages (references) to the AD converting unit (ADC group) 101L-1, the AD converting unit (ADC group) 101R-1, the AD converting unit (ADC group) 101L-2, and the AD converting unit (ADC group) 101R-2.

In Step S44, the AD converting unit (ADC group) 101L-1 converts a pixel value of the first pixel group 31L-1 into a digital signal, and outputs the result to the clamp computing unit 301L and the characteristic difference storage unit 303 as a pixel signal.

In Step S45, the AD converting unit (ADC group) 101R-1 converts a pixel value of the second pixel group 31R-1 into a digital signal and outputs the result to the clamp computing unit 301L and the characteristic difference storage unit 303 as a pixel signal.

In Step S46, the AD converting unit (ADC group) 101L-2 converts a pixel value of the third pixel group 31L-2 into a digital signal and outputs the result to the clamp computing unit 301R and the characteristic difference storage unit 303 as a pixel signal.

In Step S47, the AD converting unit (ADC group) 101R-2 converts a pixel value of the fourth pixel group 31R-2 into a digital signal, and outputs the result to the clamp computing unit 301R and the characteristic difference storage unit 303 as a pixel signal.

In Step S48, the characteristic difference storage unit 303 stores a difference value of a digital signal of any pixel of the first pixel group 31L-1 to the fourth pixel group 31R-2 as a characteristic difference.

According to the above-described process, whenever power supply is turned off, a black image is captured while an increased (or alternatively, maximum) gain is obtained, a characteristic difference (a gain component) at this time is obtained, and gains of the DACs 302L and 302R are relatively adjusted to cancel the characteristic difference (the gain component) in the characteristic difference correcting process. As a result, since it is possible to implement development of appropriate colors, it is possible to ensure image quality for a long time.

In addition, an example in which, in measuring of the characteristic difference, when a black image is imaged, a difference of the pixel signal when a gain is increased (or alternatively, maximized) is obtained as the characteristic difference, and in the ADC characteristic difference correcting process, the characteristic difference when a gain is increased (or alternatively, maximized) is absorbed has been described above. However, the characteristic difference according to a size of the gain may be obtained and used. For example, immediately before power supply is turned off, a black image in which a gain is increased (or alternatively, maximized) and a black image in which a gain is reduced (or alternatively, minimized) are imaged, the characteristic difference according to the gain is stored from linearity of each of the obtained characteristic differences. In the characteristic difference correcting process, a gain according to the characteristic difference is set and thus the characteristic difference may be cancelled.

Further, an example in which a divided exposure boundary in the pixel array unit 31 includes the left half of n columns and the right half of m columns as illustrated in the upper part in FIG. 21 has been described above. However, a boundary of the signal processing circuits 41L and 41R in the logic substrate 12 may match a boundary of the signal processing circuits 41L and 41R. In this case, n may be equal to m.

In addition, the above-described process is performed to suppress generation of vertical stripe-shaped noise that is generated by a difference of a stray capacitance in the vicinity of the boundary of the signal processing circuits 41L and 41R. Therefore, for example, the ADC group characteristic difference correcting process and the characteristic difference storing process may be executed using only an ADC group corresponding to pixels in the vicinity of the divided exposure boundary as a processing target.

5. Examples of Application to Electronic Device

The above-described solid-state imaging element 1 can be applied to various electronic devices, for example, an imaging device such as a digital still camera and a digital video camera, a mobile phone having an imaging function, or other devices having an imaging function.

Figure 24:
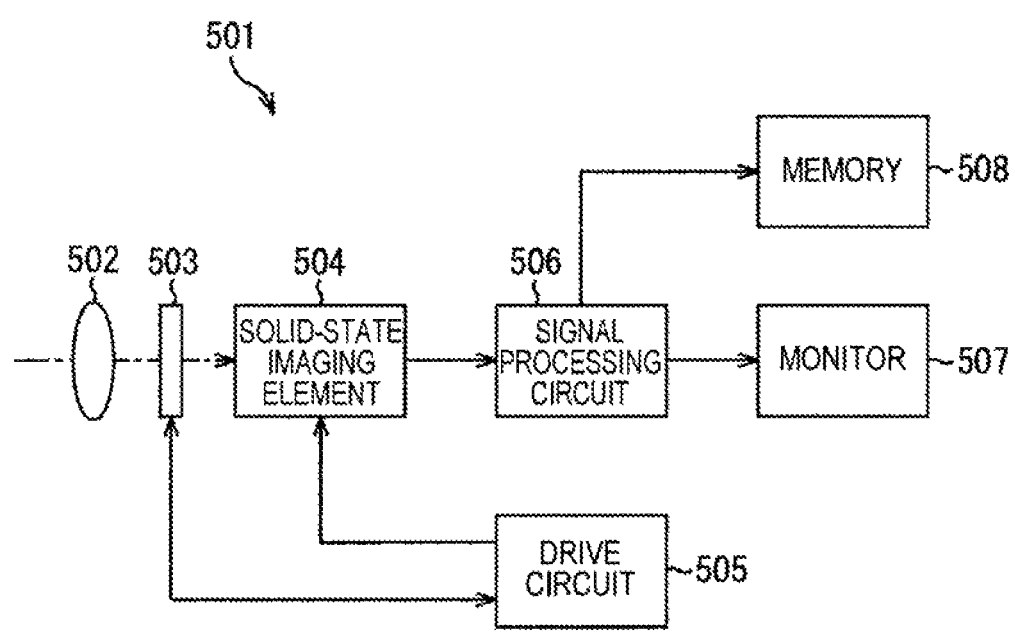
FIG. 24 is a block diagram illustrating a configuration example of an imaging device as an electronic device to which the present technology is applied.

FIG. 24 is a block diagram illustrating a configuration example of an imaging device as an electronic device to which the present technology is applied.

An imaging device 501 illustrated in FIG. 24 includes an optical system 502, a shutter device 503, a solid-state imaging element 504, a drive circuit 505, a signal processing circuit 506, a monitor 507 and a memory 508, and can image a still image and a moving image.

The optical system 502 includes one or a plurality of lenses, guides light (incident light) from a subject to the solid-state imaging element 504, and forms an image on a light receiving surface of the solid-state imaging element 504.

The shutter device 503 is disposed between the optical system 502 and the solid-state imaging element 504, and controls a light illumination period and a light-blocking period of the solid-state imaging element 504 under control of the drive circuit 505.

The solid-state imaging element 504 includes a package having the above-described solid-state imaging element. The solid-state imaging element 504 accumulates signal charges for a constant period according to light whose image is formed on a light receiving surface through the optical system 502 and the shutter device 503. The signal charges accumulated in the solid-state imaging element 504 are transferred according to a drive signal (a timing signal) supplied from the drive circuit 505.

The drive circuit 505 outputs a drive signal for controlling a transfer operation of the solid-state imaging element 504 and a shutter operation of the shutter device 503 and drives the solid-state imaging element 504 and the shutter device 503.

The signal processing circuit 506 performs various types of signal processing of signal charges output from the solid-state imaging element 504. An image (image data) obtained by signal processing performed by the signal processing circuit 506 is supplied to and displayed on the monitor 507, and is supplied to and stored (recorded) in the memory 508.

In the imaging device 501 configured in this manner as well, the solid-state imaging element 1 is applied instead of the above-described solid-state imaging element 504. Therefore, it is possible to reduce cost.

6. Use Examples of Solid-State Imaging Element

Figure 25:
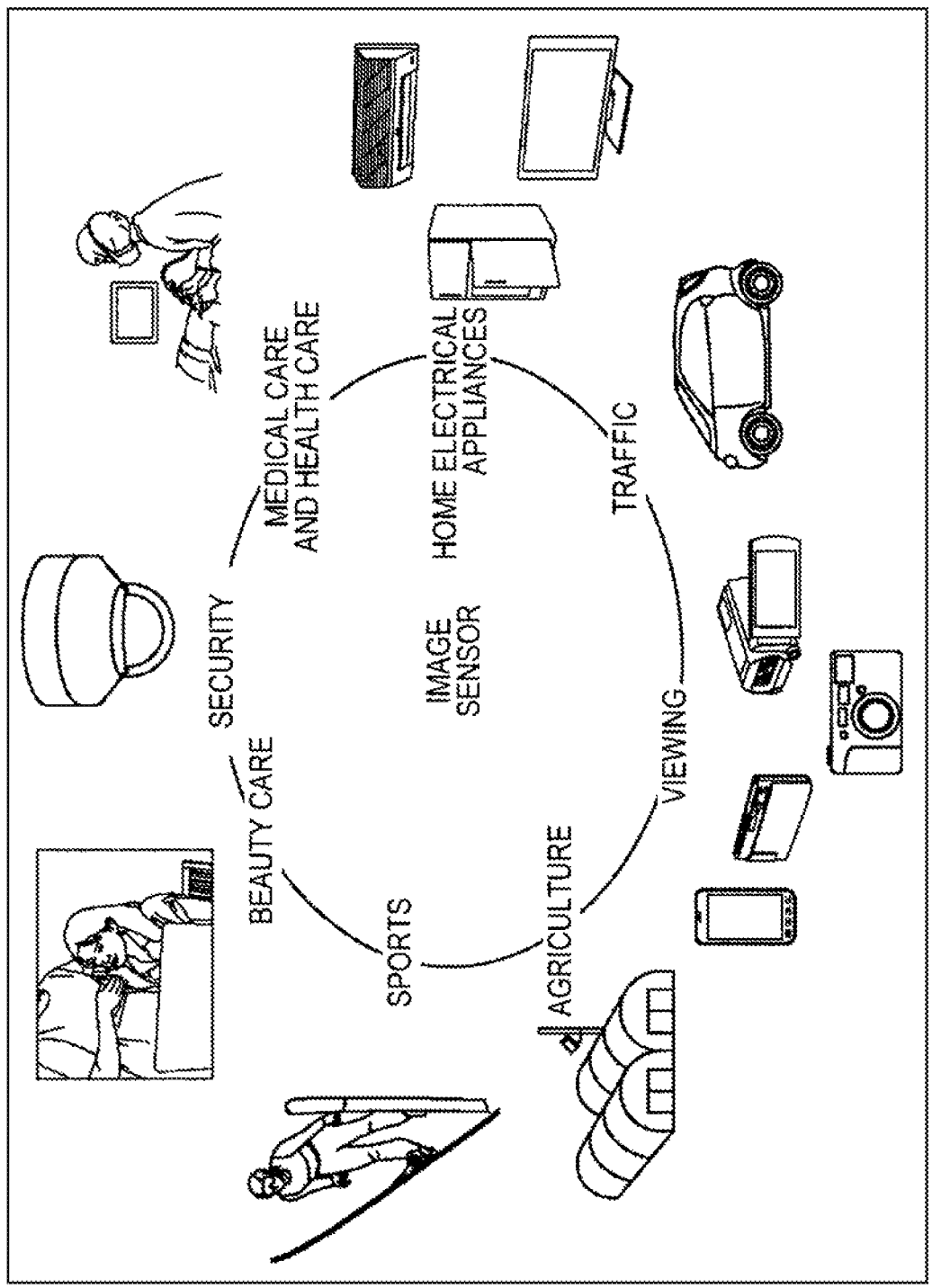
FIG. 25 is a diagram describing a use example of the solid-state imaging element to which a technology of the present disclosure is applied.

FIG. 25 is a diagram illustrating use examples in which the above-described solid-state imaging element 1 is used.

The above-described imaging element can be used for, for example, various cases in which light such as visible light, infrared light, ultraviolet light, or X-rays is detected as follows.

- Devices that take images used for viewing, such as a digital camera and a portable appliance with a camera function.
- Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.
- Devices used for home electrical appliances, such as a TV, a refrigerator, and an air conditioner, to takes images of a gesture of a user and perform appliance operation in accordance with the gesture.
- Devices used for medical care and health care, such as an endoscope and a device that performs angiography by reception of infrared light.
- Devices used for security, such as a monitoring camera for crime prevention and a camera for personal authentication.
- Devices used for beauty care, such as skin measurement equipment that takes images of the skin and a microscope that takes images of the scalp.
- Devices used for sports, such as an action camera and a wearable camera for sports and the like.
- Devices used for agriculture, such as a camera for monitoring the condition of the field and crops.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1)

A solid-state imaging element, comprising:

a first substrate including a pixel circuit having a pixel array unit; and a second substrate including:

signal processing circuits to process signals from the pixel array unit; and a wiring layer with wiring regions electrically connected to respective ones of the signal processing circuits, wherein each signal processing circuit has a same circuit pattern, wherein the second substrate and the first substrate are stacked, and wherein a wiring pattern of each wiring region is different.

(2)

The solid-state imaging element according to (1), wherein the wiring layer is a part of a wiring structure in the second substrate and is stacked on another part of the wiring structure.

(3)

The solid-state imaging element according to (1), wherein the wiring layer is an entire wiring structure in the second substrate.

(4)

The solid-state imaging element according to (1), wherein a first one of the wiring regions corresponds to a first logic circuit of the second substrate, and wherein a second one of the wiring regions corresponds to a second logic circuit of the second substrate.

(5)

The solid-state imaging element according to (1), wherein identical elements of the signal processing circuits have identical patterns.

(6)

The solid-state imaging element according to (1), wherein the signal processing circuits have a configuration including $2^n$ types of functions and switch the functions according to an n-bit switching signal.

(7)

The solid-state imaging element according to (6), wherein the n-bit switching signal is fixed to Hi or Low in a processing procedure.

(8)

The solid-state imaging element according to (6), wherein the n-bit switching signal is fixed to Hi or Low through a bonding inside a logic substrate.

(9)

The solid-state imaging element according to (6), wherein a line of the n-bit switching signal is connected to a register and is controlled from an outside.

(10)

The solid-state imaging element according to (6), wherein a line of the n-bit switching signal is connected to a configuration in which a state is fixed to Hi or Low according to stress of electromagnetic waves including electricity or light such as ultraviolet light.

(11)

The solid-state imaging element according to (6), wherein the n-bit switching signal line is connected to a non-volatile memory and a state of the non-volatile memory is set from an outside.

(12)

The solid-state imaging element according to (6), wherein a line of the n-bit switching signal is connected to an external terminal and the switching signal is set by an external device through the external terminal.

(13)

The solid-state imaging element according to (1), wherein the signal processing circuits include:

a first signal processing circuit to process signals from a first portion of the pixel array unit; and a second signal processing circuit to process signals from a second portion of the pixel array unit.

(14)

The solid-state imaging element according to (13), wherein the first portion corresponds to a left side of a captured image, and wherein the second portion corresponds to a right side of the captured image.

(15)

The solid-state imaging element according to (14), wherein the first signal processing circuit processes the signals from the first portion at a different time than the second signal processing circuit processes the signals from the second portion.

(16)

The solid-state imaging element according to (1), wherein a function of each signal processing circuit is changeable based on the wiring pattern of each wiring region connected to each signal processing circuit.

(17)

The solid-state imaging element according to (1), wherein the second substrate includes a spacing region between the signal processing circuits.

(18)

An imaging device, comprising:

a first substrate including a pixel circuit having a pixel array unit; and a second substrate including:

signal processing circuits to process signals from the pixel array unit; and a wiring layer with wiring regions connected to respective ones of the signal processing circuits, wherein each signal processing circuit has a same circuit pattern, wherein the second substrate is stacked on the first substrate, and wherein a wiring pattern of each wiring region is different.

(19)

The imaging device according to (18), wherein the signal processing circuits have a configuration including a circuit having $2^n$ types of functions and switch the functions according to an n-bit switching signal.

(20)

An electronic device, comprising:

a first substrate including a pixel circuit having a pixel array unit; and a second substrate including:

signal processing circuits to process signals from the pixel array unit; and a wiring layer with wiring regions connected to respective ones of the signal processing circuits, wherein each signal processing circuit has a same circuit pattern, wherein the second substrate is stacked on the first substrate, and wherein a wiring pattern of each wiring region is different.

(21)

The electronic device according to (20), wherein the signal processing circuits have a configuration including a circuit having $2^b$ types of functions and switch the functions according to an n-bit switching signal.

REFERENCE SIGNS LIST 1 solid-state imaging element
11 pixel substrate
12 logic substrate
12L, 12R bonding
21 pixel circuit
31 pixel array unit
32 unit pixel
41L, 41R signal processing circuit
42 spacing (or scribing) region
67L, 67R memory unit
68L, 68R data processing unit
69L, 69R interface unit
81L-1 to 81R-n AD converter
101L-1 to 101R-2 AD converting unit
102L-1 to 102R-2 memory unit
103L, 103R logic unit
104L-1 to 104R-2 interface unit
105L-1 to 105R-4 via
151 substrate layer
152 wiring layer
152L, 152R terminal
161, 162, 171 wiring layer
181, 181L, 181R terminal
201, 201L, 201R register
221, 221L, 221R eFuse
241, 241L, 241R EEPROM
251, 251L, 251R external terminal
271, 271L, 271R signal processing unit
281, 281L, 281L-1, 281L-2, 281R, 281R-1, 281R-2 multiplier unit
291, 291L, 291R analog signal processing unit
292, 292L, 292R digital signal processing unit
301, 301L, 301R clamp computing unit
302, 302L, 302R DAC, 303 characteristic difference storage unit

The invention claimed is:

1. A solid-state imaging element, comprising:
a first substrate including a pixel circuit having a pixel array unit; and
a second substrate including:
signal processing circuits to process signals from the pixel array unit; and
a wiring layer with wiring regions electrically connected to respective ones of the signal processing circuits,
wherein each signal processing circuit has a same circuit pattern,
wherein the second substrate and the first substrate are stacked, and wherein a wiring pattern of each wiring region is different,
wherein a function of each signal processing circuit is changeable based on the wiring pattern of each wiring region connected to each signal processing circuit.

2. The solid-state imaging element according to claim 1, wherein the wiring layer is a part of a wiring structure in the second substrate and is stacked on another part of the wiring structure.

3. The solid-state imaging element according to claim 1, wherein the wiring layer is an entire wiring structure in the second substrate.

4. The solid-state imaging element according to claim 1,
wherein a first one of the wiring regions corresponds to a first logic circuit of the second substrate, and
wherein a second one of the wiring regions corresponds to a second logic circuit of the second substrate.

5. The solid-state imaging element according to claim 1, wherein identical elements of the signal processing circuits have identical patterns.

6. The solid-state imaging element according to claim 1, wherein the signal processing circuits have a configuration including $2^n$ types of functions and switch the functions according to an n-bit switching signal.

7. The solid-state imaging element according to claim 6, wherein the n-bit switching signal is fixed to Hi or Low in a processing procedure.

8. The solid-state imaging element according to claim 6, wherein the n-bit switching signal is fixed to Hi or Low through a bonding inside a logic substrate.

9. The solid-state imaging element according to claim 6, wherein a line of the n-bit switching signal is connected to a register and is controlled externally.

10. The solid-state imaging element according to claim 6, wherein a line of the n-bit switching signal is connected to a configuration in which a state is fixed to Hi or Low according to stress of electromagnetic waves including electricity or light.

11. The solid-state imaging element according to claim 6, wherein the n-bit switching signal line is connected to a non-volatile memory and a state of the non-volatile memory is set externally.

12. The solid-state imaging element according to claim 6, wherein a line of the n-bit switching signal is connected to an external terminal and the switching signal is set by an external device through the external terminal.

13. The solid-state imaging element according to claim 1, wherein the signal processing circuits include:
a first signal processing circuit to process signals from a first portion of the pixel array unit; and
a second signal processing circuit to process signals from a second portion of the pixel array unit.

14. The solid-state imaging element according to claim 13, wherein the first portion corresponds to a left side of a captured image, and wherein the second portion corresponds to a right side of the captured image.

15. The solid-state imaging element according to claim 14, wherein the first signal processing circuit processes the signals from the first portion at a different time than the second signal processing circuit processes the signals from the second portion.

16. The solid-state imaging element according to claim 4, wherein the first one of the wiring regions overlaps the first logic circuit in a plan view, and the second one of the wiring regions overlaps the second logic circuit in a plan view.

17. The solid-state imaging element according to claim 1, wherein the second substrate includes a spacing region between the signal processing circuits.

18. An imaging device, comprising:
a first substrate including a pixel circuit having a pixel array unit; and
a second substrate including:
a first signal processing circuit to process signals from a first portion of the pixel array unit;
a second signal processing circuit to process signals from a second portion of the pixel array unit different than the first portion; and
a wiring layer with a first wiring region connected to the first signal processing circuit, and a second wiring region connected to the second signal processing circuit,
wherein first and second signal processing circuits have a same circuit pattern,
wherein the second substrate is stacked on the first substrate,
wherein, in a plan view, the first signal processing circuit is spaced apart from the second signal processing circuit,
wherein a first wiring pattern of the first wiring region has a different pattern than a second wiring pattern of the second wiring region,
wherein, in the plan view, the first wiring pattern overlaps the first signal processing circuit, and
wherein, in the plan view, the second wiring pattern overlaps the second signal processing circuit.

19. The imaging device according to claim 18, wherein the first and second signal processing circuits have a configuration including a circuit having $2^n$ types of functions and switch the functions according to an n-bit switching signal.

20. An electronic device, comprising:
a first substrate including a pixel circuit having a pixel array unit; and
a second substrate including:
a first signal processing circuit to process signals from a first portion of the pixel array unit;
a second signal processing circuit to process signals from a second portion of the pixel array unit different than the first portion; and
a wiring layer with wiring regions connected to respective ones of the signal processing circuits,
wherein the first and second signal processing circuits have a same circuit pattern,
wherein the second substrate is stacked on the first substrate,
wherein, in a plan view, the first signal processing circuit is spaced apart from the second signal processing circuit,
wherein a first wiring pattern of the first wiring region has a different pattern than a second wiring pattern of the second wiring region,
wherein, in the plan view, the first wiring pattern overlaps the first signal processing circuit, and
wherein, in the plan view, the second wiring pattern overlaps the second signal processing circuit.

21. The electronic device according to claim 20, wherein the first and second signal processing circuits have a configuration including a circuit having $2^n$ types of functions and switch the functions according to an n-bit switching signal.

* * * * *